US008104000B2

(12) United States Patent
Bjesse

(10) Patent No.: US 8,104,000 B2
(45) Date of Patent: Jan. 24, 2012

(54) METHOD AND APPARATUS FOR MEMORY ABSTRACTION AND FOR WORD LEVEL NET LIST REDUCTION AND VERIFICATION USING SAME

(75) Inventor: Per M. Bjesse, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 658 days.

(21) Appl. No.: 12/258,759

(22) Filed: Oct. 27, 2008

(65) Prior Publication Data

US 2010/0107132 A1   Apr. 29, 2010

(51) Int. Cl.
*G06F 17/50* (2006.01)
(52) U.S. Cl. .................... 716/106; 716/111; 716/116
(58) Field of Classification Search ............ 716/106, 716/111, 116
See application file for complete search history.

(56) References Cited

U.S. PATENT DOCUMENTS

| | | | |
|---|---|---|---|
| 6,574,787 B1 | 6/2003 | Anderson | |
| 2003/0208730 A1 | 11/2003 | Singhal et al. | |
| 2005/0050484 A1 | 3/2005 | Keller et al. | |
| 2010/0077366 A1* | 3/2010 | Bjesse | 716/5 |
| 2011/0010141 A1* | 1/2011 | Jabir | 703/2 |

FOREIGN PATENT DOCUMENTS

JP   2008033404 A   2/2008

OTHER PUBLICATIONS

Search Report Mailed Mar. 31, 2010 in PCT/US2009/05530 10 pages.
Search Report Mailed Apr. 1, 2010 in PCT/US2009/05537 12 pages.
Jain, Himanshu, et al., "Word-Level Predicate-Abstraction and Refinement Techniques for Verifying RTL Verilog," IEEE Transactions on Computer-Aided Design of Integrated Circuits and Systems, vol. 27, No. 2, Feb. 2008, 14 pages.
Adams, Sara, et al., "Automatic Abstraction in Symbolic Trajectory Evaluation," Proc. of the Formal Methods in CAD conf. 2007, 23 pages.
Armando, Alessandro, et al., "Abstraction Refinement of Linear Programs with Arrays," Proc. International Conference on Tools and Algorithms for the Construction and Analysis of Systems LNCS 4424 pp. 373-388, 2007.
Bjesse, Per, "A Practical Approach to Word Level Model Checking of Industrial Netlists," 20th Int'l Conf. on Computer Aided Design, Jul. 2008, 13 pages.

(Continued)

*Primary Examiner* — Sun Lin
(74) *Attorney, Agent, or Firm* — Haynes Beffel & Wolfeld LLP

(57) ABSTRACT

A computer implemented representation of a circuit design including memory is abstracted to a smaller netlist by replacing memory with substitute nodes representing selected slots in the memory, segmenting word level nodes, including one or more of the substitute nodes, in the netlist into segmented nodes, finding reduced safe sizes for the segmented nodes and generating an updated data structure representing the circuit design using the reduced safe sizes of the segmented nodes. The correctness of such systems can require reasoning about a much smaller number of memory entries and using nodes having smaller bit widths than exist in the circuit design. As a result, the computational complexity of the verification problem is substantially reduced.

31 Claims, 21 Drawing Sheets

OTHER PUBLICATIONS

Bryant, Randal E., et al., "Modeling and Verifying Systems using a Logic of Counter Arithmetic with Lambda Expressions and Uninterpreted Functions," Lecture Notes in Computer Science; vol. 2404 archive, Proceedings of the 14th International Conference on Computer Aided Verification pp. 78-92 Year of Publication: 2002.

Burch, Jerry R., et al., "Automatic verification of Pipelined Microprocessor Control," In Proceedings of the 6th international Conference on Computer Aided Verification (Jun. 21-23, 1994). D. L. Dill, Ed. Lecture Notes in Computer Science, vol. 818. Springer-Verlag, London, 68-80.

Clarke, E. M., et al, "Word level model checking-avoiding the Pentium FDIV error.," In Proceedings of the 33rd Annual Conference on Design Automation (Las Vegas, Nevada, United States, Jun. 3-7, 1996). DAC '96. ACM, New York, NY, 645-648.

Clarke, Edmund, "Counterexample-Guided Abstraction Refinement," Proc. of the computer aided verification conf. 2000, 2 pages.

Galler, Bernard A., et al., "An Improved Equivalence Algorithm," Communications of the ACM archive, vol. 7 , Issue 5 (May 1964) pp. 301-303.

Ganai, Malay K., et al., "Efficient Modeling of Embedded Memories in Bounded Model Checking," in Proceedings of Computer Aided Verification (CAV), 2004 13 pages.

Ganai, Malay K., et al., "Verification of embedded memory systems using efficient memory modeling," Design, Automation and Test in Europe, 2005. Proceedings 2005 pp. 1096-1101 vol. 2.

Glokler, Tilman, et al., "Enabling Large-Scale Pervasive Logic Verification through Multi-Algorithmic Formal Reasoning," Formal Methods in Computer Aided Design, 2006. FMCAD '06, Nov. 2006 pp. 3-10.

Hojati, R. and Brayton, R. K. 1995. Automatic Datapath Abstraction in Hardware Systems. In Proceedings of the 7th international Conference on Computer Aided Verification (Jul. 3-5, 1995). P. Wolper, Ed. Lecture Notes in Computer Science, vol. 939. Springer-Verlag, London, 98-113.

IP, C. Norris, et al., "Better Verfication Through Symmetry," Formal Methods in System Design 9, 41-75, 1996.

Johannsen, Peer, Dissertation, "Speeding Up Hardware Verification by Automated Data Path Scaling," Aug. 2002, 201 pages.

Manolios, Panagiotis, et al., "BAT: The Bit-Level Analysis Tool," Proceedings of Computer Aided Verification (CAV) 2007, LNCS 4590, pp. 303-306, 2007.

McMillan, K.L., "Verfication of an implementation of Tomasulo's algorithm by compositional model checking," In A. Hu and M. Vardi (editors) Proc. 10th International Conference on Computer Aided Verification (CAV'98), vol. 1427 of LNCS, pp. 110-121, Springer. 1998.

Peh, Li-Shiuan, et al., "A Delay Model and Speculative Architecture for Pipelined Routers," Proc. 7th Int'l Symp on High-Performance Computer Architecture, Jan. 22-24, 2001, Monterrey, Mexico, pp. 255-266.

Pugh, William, "Skip Lists: A Probabilistic Alternative to Balanced Trees," Communications of the ACM, vol. 33, No. 6, Jun. 1990, 9 pages.

Ranise, Silvio et al, "Satisfiability Modulo Theories," p. 77-79, IEEE Nov./Dec. 2006, Trends & Controversies, Intelligent Systems and Formal Methods in Software Engineering.

Seger, Carl-Johan H., et al., "Formal Verification by Symbolic Evaluation of Partially-Ordered Trajectories," Technical Report. UMI Order No. TR-93-08., University of British Columbia, Jul. 1, 1999, 41 pages.

Sheeran, Mary, et al., "Checking Safety Properties Using Induction and a SAT-Solver," In Proceedings of the Third international Conference on Formal Methods in Computer-Aided Design (Nov. 1-3, 2000). W. A. Hunt and S. D. Johnson, Eds. Lecture Notes in Computer Science, vol. 1954. Springer-Verlag, London, 108-125.

* cited by examiner

BEFORE MAKE COMPATIBLE:
s1 = [0..0, 1..31]  
s2 = [32..33, 34..63]  
AFTER:
s1 = [0..0, 1..1, 2..32]  
s2 = [32..32, 33..33, 34..63]  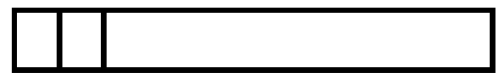
FIG. 16

METHOD AND APPARATUS FOR MEMORY ABSTRACTION AND FOR WORD LEVEL NET LIST REDUCTION AND VERIFICATION USING SAME

BACKGROUND

1. Field of the Invention

The present invention relates to integrated circuit design, and more particularly to electronic design automation tools and tools for verification and analysis of complex designs including memory.

2. Description of Related Art

Analysis of word-level designs, which leverages design information captured at a higher level than that of individual wires and primitive gates, is a new frontier in hardware verification. At the word level, data path elements and data packets are viewed as entities in their own right as opposed to a group of bit-level signals without any special semantics.

Today's model checking technology works well for checking control oriented properties. However, it does not work well with designs where there are wide datapaths, and large memories. Previous approaches tried to speed up the process by reading designer annotations, or computing increasingly precise abstractions of the design. However, annotations are very time consuming for the designer, and the computation of abstractions can be as hard as solving the original problem.

There has been a lot of activity lately around word-level formula decision procedures such as SMT solvers (S. Ranise and C. Tinelli. *Satisfiability modulo theories. Trends and Controversies*—IEEE Intelligent Systems Magazine, December 2006) and reduction-based procedures like UCLID (R. Bryant, S. Lahiri, and S. Seshia. *Modeling and verifying systems using a logic of counter arithmetic with lambda expressions and uninterpreted functions*. In Proc. of the Computer Aided Verification Conf., 2002) and BAT (P. Manolios, S. Srinivasan, and D. Vroon. *BAT: The bit-level analysis tool*. In Proc. of the Computer Aided Verification Conf., 2007). However, as promising as this direction of research is, the use of these procedures for model checking is inherently restricted in that they analyze formulas rather than sequential systems. This has two consequences: First of all, sequential properties can only be checked using these procedures by relying on methods such as induction and interpolation that employ bounded checks to infer unbounded correctness. Second, these procedures do not fit into a transformation-based approach to sequential system verification (J. Baumgartner, T. Gloekler, D. Shanmugam, R. Seigler, G. V. Huben, H. Mony, P. Roessler, and B. Ramanandray. *Enabling large-scale pervasive logic verification through multi-algorithmic formal reasoning*. In Proc. of the Formal Methods in CAD Conf., 2006), where sequential verification problems are iteratively simplified and processed by any of a large set of back-end model checkers.

One of the largest stumbling blocks for traditional model checking is the presence of large memories intermingled with complex control logic. This will typically result in very hard or intractable model checking problems. Therefore, it would be desirable to efficiently implement for practical word-level model checking of both bounded and unbounded properties for hardware designs including large memories.

SUMMARY

A netlist reduction method is provided where a netlist for a circuit design including memory is abstracted to smaller netlist, which can be analyzed by standard verification tools and by other tools that operate on netlists. The correctness of such systems can require reasoning about a much smaller number of memory entries than exist in the original circuit design. By abstracting such memories to a smaller number of entries, the computational complexity of the verification problem is substantially reduced.

A computer implemented representation of a circuit design can be reduced in a method that includes representing the circuit design as a data structure defining a netlist including a plurality of nodes, such as in the form of a directed acyclic graph DAG. For example, a circuit design represented by a high-level description language can be processed to produce this type of input data structure. The input data structure is processed to produce an updated netlist with less complexity, requiring fewer memory slots and nodes with reduced bit widths for implementation, while attempting to maintain prespecified properties of the circuit design represented by the netlist.

The processing of the input netlist includes identifying memories in the circuit design, and identifying an address of a slot, or addresses of slots, in an identified memory for which the corresponding slot or corresponding slots are needed to meet a specified property of interest. The nodes in the netlist representing such memories are replaced with substitute nodes implementing the slot or slots. Word level nodes in the netlist are segmented and reduced safe sizes for the segmented nodes are found. Then an updated data structure is implemented using the segmented nodes and the reduced safe sizes. A verification condition is implemented that enables checking of the specified property using the updated data structure. Applying the processes described herein, the size of the memory represented in the updated netlist is reduced by eliminating nodes representing slots that are not needed to meet the specified property.

The slot or slots of identified memories in the netlist are replaced with substitute nodes, including for each represented slot a current state substitute node (named "cont" in examples below) containing the data for the represented slot, a next state substitute node, and a node (named "sel" in examples below) and corresponding next state node, identifying the represented slot by its address. Nodes representing writes to a represented slot are implemented using a multiplexer that updates the contents of the next state substitute node for the slot with write data if the write address matches the contents of the node identifying the slot, or else updates the contents of the next state substitute node for the represented slot with contents of the current state substitute node. For nodes in the netlist representing reads to a represented slot, the substitute nodes include a multiplexer returning the contents of the current state substitute node for the represented slot if the read address matches the contents of the node identifying the slot, or else returns non-determinate data read from the environment.

The process of identifying memories in the input netlist, includes identifying remodellable memories (including parts of memory arrays or complete memory arrays), which are characterized in that all read and write nodes addressing the current state and the next state nodes of the memory read and write data of the same width and use address nodes of the same width, and that the slot or slots in the memory are initialized to a determinate value in a common manner.

Slots to be represented in the updated netlist are selected by identifying abstraction pairs, where the abstraction pairs contains respective nodes describing a corresponding slot in the memory which must be represented and describing during which cycles they must be represented, in the updated netlist in order to satisfy a property such as a safety definition for the circuit design. Thus, the abstraction pairs correspond with a represented slot represented in the updated netlist, and include a node identifying the represented slot and a delay parameter indicating a cycle in which the represented slot is read to satisfy the property.

A verification function in the form of a combinational output is re-written so that the output is checked when the nodes specified in the abstraction pairs have had values corresponding to the corresponding slots in the appropriate previous cycle times. The abstraction pairs relevant to a particular property of interest are used in the implementation of the updated netlist, to establish a set of nodes in the updated netlist that for each abstraction pair specifying a represented slot in an indicated cycle, compares the abstracted node with the node identifying the represented slot in the cycle indicated by the delay parameter of the abstraction pair. If matches are indicated for the relevant abstraction pairs, then the output of the property of interest is checked.

The abstraction pairs are identified using a counter-example guided refinement process in one implementation described herein. For example, abstraction pairs can be identified by iteratively performing a model checking process over the updated netlist, starting with an initial updated netlist such as an implementation with no abstraction pairs. If the model checking fails in a particular state, the trace causing the failure is captured, and then using the original input netlist a simulation is run based on the set of inputs and initial state variable assignments determined from the trace from the particular state. If the simulation of the original netlist does not indicate the failure, then the updated netlist is processed to find erroneous reads responsible for the failure. Abstraction pairs are selected to address the erroneous reads, and the selected abstraction pairs are added to the updated netlist. The iteration returns to the model checking step, and repeats the process, until the updated netlist passes the model checking, until a real bug is detected in the simulation step, or until the updated netlist becomes larger than a target size.

In implementations using the directed acyclic graph data structure mentioned above, top-level nodes in the graph include word-level nodes representing circuit outputs and next-state variables, bottom-level nodes in the graph include said word-level nodes representing inputs, state variables and binary constant vectors, and internal nodes in the graph include memories and word-level nodes representing operators.

The technology introduced in the present application processes a word-level netlist to identify remodellable memories which interact with their environment using dedicated read and write nodes only, are initialized in a uniform way, and are accessed uniformly. The remodellable memories can be abstracted in a manner that allows proofs for properties when the proof can be done by reasoning about a significantly smaller number of memory slots and time instances than would be needed in a standard bit-level model check.

The word level nodes, including the substitute nodes, are processed to provide reduced bit widths as mentioned above. The bit width reduction process can be much more powerful after memory abstraction, resulting in greater reductions in the netlist than can be achieved using bit width reduction processes alone. Also, by performing memory abstraction before processing to provide reduced bit widths for the word level nodes in the netlist, the complexity of the bit width reduction process is substantially reduced. In a procedure described herein, a first set of word-level nodes is identified in the netlist that includes nodes including the substitute nodes having some data path segments that are treated uniformly. The first set of word-level nodes is segmented into segment widths that correspond to uniformly treated segments of the corresponding words. A second set of nodes that does not include uniformly treated segments as used for identifying the first set of nodes, are converted into bit-level nodes. The segmented nodes are analyzed to define reduced safe sizes by applying a computer implemented function. An updated data structure representing the circuit design is then generated using the reduced safe sizes of the segmented nodes. The updated data structure can then be analyzed to determine whether the circuit design satisfies a pre-specified property, such as a safety property, and in a preferred mode can fit into a transformation-based approach to sequential system verification in a data processing system used for integrated circuit design and manufacturing.

In implementations using the directed acyclic graph data structure mentioned above, top-level nodes in the graph include said word-level nodes representing circuit outputs and next-state variables; bottom-level nodes in the graph include said word-level nodes representing inputs, current state variables and binary constant vectors; and internal nodes in the graph include said word-level nodes representing operators.

The first set of nodes for a particular circuit design includes one or more substitute nodes representing slots in the memory, word-level nodes representing comparison operators for (equal to) and (not equal to), word-level nodes representing multiplexer operators, word-level nodes representing concatenation operators, word-level nodes representing extraction operators, word-level nodes representing inputs, word-level nodes representing state variables and word-level nodes representing binary constants. The second set of nodes for a particular design includes word-level nodes representing arithmetic operators, word-level nodes representing comparison operators for (less than), (less than or equal to), (greater than), and (greater than or equal to), word-level nodes representing logical AND operators, and word-level nodes representing logical NOT operators.

The segmenting and converting processes are facilitated by registering each node in the data structure and constructing a partition list for the node, identifying the segmentation of the node, and a dependency group including each segment of the node. The partition list and the dependency group constructed when the node is registered identify a single segment of the node including bits (0 ... k−1) where the node has a width k. The dependency groups are maintained in the process so that they identify nodes that depend upon a particular node being registered, and nodes upon which it depends. The segmenting operation splits nodes within a particular dependency group that includes a particular node, until the segmentations of the nodes in the dependency group match. The converting operation splits nodes in the dependency group into single bit segments.

Preferably, the partition lists for nodes are maintained in a data structure organized for probabilistic search, such as a skip list data structure.

Reduced safe sizes are found in embodiments using dependency groups by processing the segments of nodes in the dependency groups to find reduced safe sizes for the segments, and then summing the segments for each node. A useful formula for finding reduced safe sizes is that the reduced safe size is min($S$, $\log_2(N_S+2)$), where the dependency group includes a segments of width $S$, and a number $N_S$ of state variable and input segments of size $S$ and at most 2 constants.

The technology described herein can be implemented as a process executed on a data processing machine, as a data processing machine adapted to execute the procedures described, and as a computer program executable by a data processing machine, and stored on a computer readable data storage medium. In addition, the technology herein is part of a process for manufacturing an integrated circuit including the development of data defining a pattern, such as layout data for a mask or a set of masks used in lithographic processes in integrated circuit manufacturing.

Features of processes described herein include that implementations can operate on standard safety property verification problems, can be completely automatic without any need for abstraction hints, can be useable with typical bit-level model checkers as a back-end decision procedure, and can fit seamlessly into a standard transformational verification paradigm.

Other aspects and advantages of the present invention can be seen in the drawings, detailed description and claims which follow.

BRIEF DESCRIPTION OF THE DRAWINGS

FIG. 16 illustrates an operation to merge dependency groups for a set of nodes.

DETAILED DESCRIPTION

Figure 1:
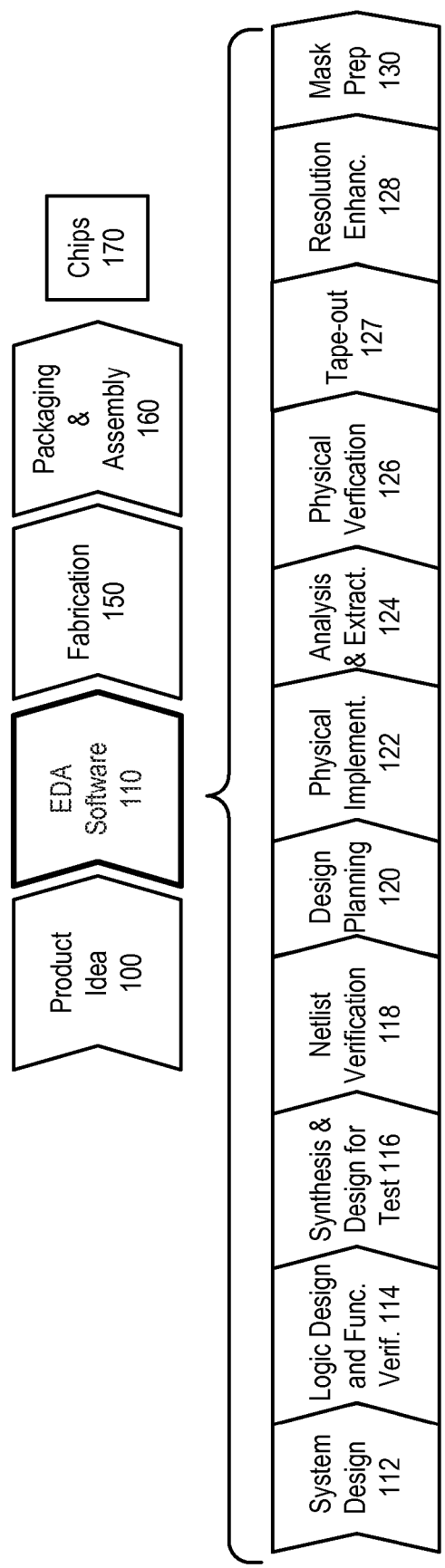
FIG. 1 shows a simplified representation of an illustrative integrated circuit design flow.

FIG. 1 is a simplified representation of an illustrative integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied. Such rearrangement possibilities will be apparent to the reader.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (block 110) will now be provided.

System design (block 112): The designers describe the functionality that they want to implement, they can perform what-if planning to refine functionality, check costs, etc. Hardware-software architecture can occur at this stage. Example EDA software products from Synopsys, Inc. that can be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products. The word-level netlist reduction technology using memory abstraction as described in more detail below can be implemented as a part of, or as an add-on tool, for the Magellan product for example.

Synthesis and design for test (block 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Complier, FPGA Compiler, TetraMAX, and DesignWare® products.

Netlist verification (block 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (block 124): At this step, the circuit function is verified at a transistor level, this in turn permits what-if refinement. Example EDA software products from Synopsys, Inc. that can be used at this stage include AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Tape-out (block 127): This stage provides the "tape-out" data for production of masks for lithographic use to produce finished chips. Example EDA software products from Synopsys, Inc. that can be used at this stage include the CATS(R) family of products.

Resolution enhancement (block 128): This stage involves geometric manipulations of the layout to improve manufacturability of the design. Example EDA software products from Synopsys, Inc. that can be used at this stage include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS(R) family of products.

Embodiments of the netlist reduction technology described herein can be used during one or more of the above-described stages. For example, embodiments of the present invention can be used during logic design and functional verification (block 114 of FIG. 1). At this stage, the VHDL or Verilog code for modules in the system is written and the design is checked for functional accuracy. More specifically, the design is checked to ensure that it produces the correct outputs in response to particular input stimuli.

Figure 2:
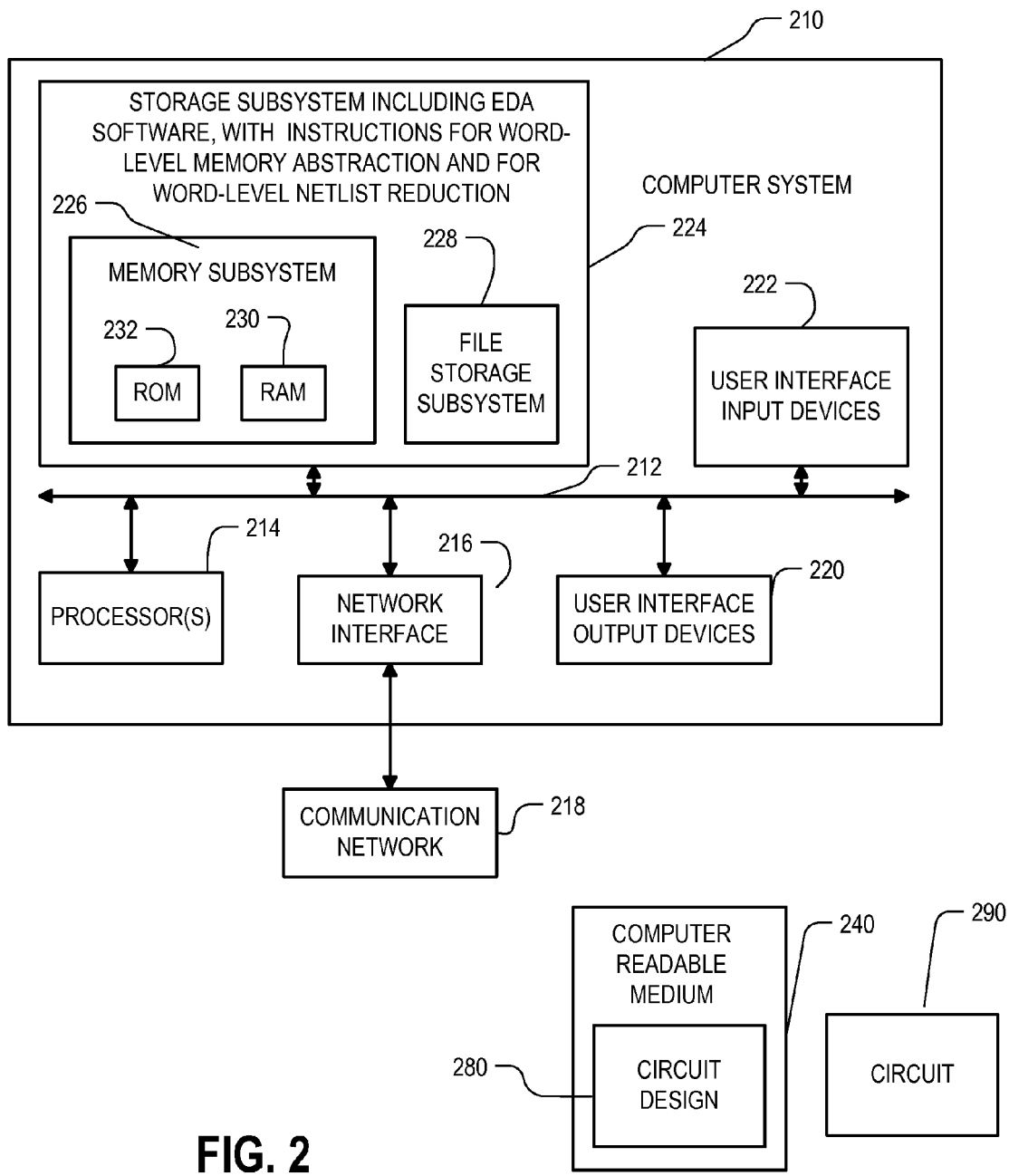
FIG. 2 is a simplified block diagram of a computer system suitable for use with embodiments of the technology, as well as a circuit design and circuit embodiments of the technology.

FIG. 2 is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including the memory abstraction and word level netlist reduction technology and verification tools applied for analysis of the reduced netlist. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with network interface subsystem 216. The computer readable medium can be a hard disk, a floppy disk, a CD-ROM, an optical medium, removable media cartridge, or electromagnetic wave. The computer readable medium 240 is shown storing a circuit design 280, including for example an HDL description of a circuit design, and a reduced netlist created with the described technology. Also shown is a circuit 290 created with the described technology.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2 is intended only as a specific example for purposes of illustrating the preferred embodiments. Many other configurations of computer system 210 are possible having more or less components than the computer system depicted in FIG. 2.

Figure 3:
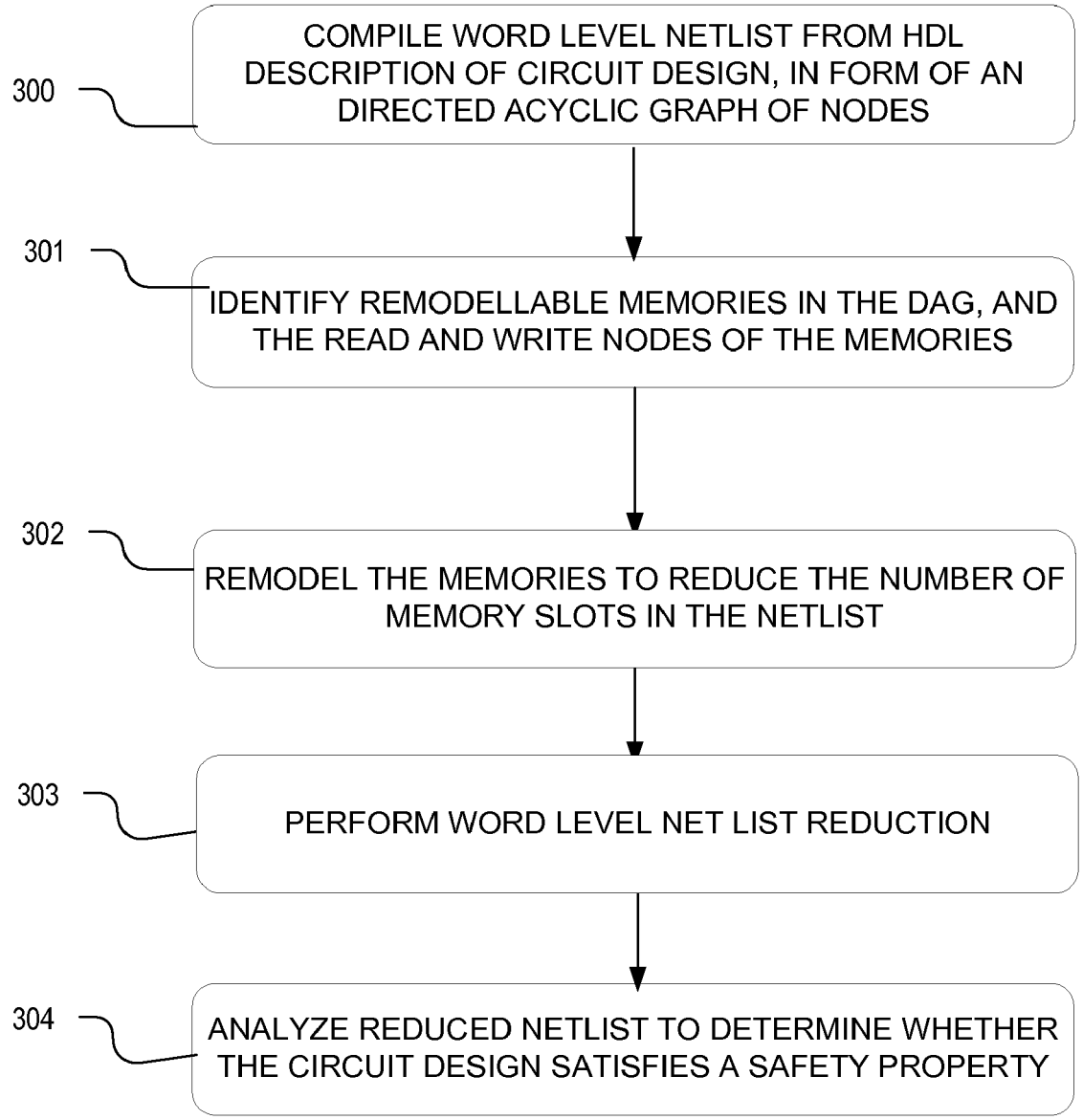
FIG. 3 is a simplified flow chart for a process for reducing the size of a data structure representing a circuit design including memory, and performing a verification process using the reduced data structure.

FIG. 3 is a basic flowchart for a process for performing a verification step for a circuit design that includes operating on a reduced netlist. In the process of FIG. 3, a word-level netlist including a plurality of nodes is compiled from a high-level description language description of a circuit design, preferably in the form of a directed acyclic graph of nodes (block 300). Embodiments of the memory abstraction technology operate on word-level nodes. However, alternative systems can be applied to bit-level implementations. A standard front end flow takes a Register Transfer Level (RTL) description expressed for example in Hardware Description Language (HDL), supplemented with the definitions of user constraints, properties and other information, and produces the implicitly clocked DAG representation described in detail below. A standard front end flow is used which compiles a circuit design into netlists by processing a hardware design with properties and constraints into a plurality of nodes representing combinational logic over a set of unconstrained inputs I, state variables S and constants. The top of the resulting plurality of nodes contain next-state variables S' and single bit outputs O. The properties which can be verified using this technology include all safety properties whose failure is signaled by some output assuming the value "false". A safety property is a subclass of properties of circuit design, which has the form that some output always holds (i.e., whose failure can always be shown by a finite trace). In addition, each state variable can be assumed to have unknown initial state in some embodiments.

The internal nodes in a graph compiled in this manner include the following:

```
node1 = not(node2)
node1 = and(node2, node3)
node1 = arithOp(node2, node3), for arithOp being a member of {+, −, ...}
node1 = compOp(node2, node3), for compOp being a member of {less
    than, less than or equal to, equal to, not equal to, greater than or
    equal to, greater than}
node1 = mux(selector, node2, node3)
node1 = extract(x, node2)
node1 = concat(node2, node3, ...)
node1 = read(op1, addrj)
node1 = write(opk, addri, dataj)
```

The "not" and "and" operators are bitwise operators in the sense that bit i of the result is generated by applying the Boolean operator to bit i of the input nodes. The "mux" node returns node2 if selector is true and node 3 otherwise. The "extract" node constructs a smaller bit vector by projecting out k bits from position (x) to (x+k−1) of its operand. Finally, the "concat" node forms a larger signal by concatenating its operands to form a larger bit vector. Earlier operands in the argument list to concat become higher order bits, so concat (01, 00) becomes 0100.

The select signal of mux and the output of comparison operator nodes are restricted to have a bit width of one. Such signals are said to be bit-level signals. Signals that are not bit-level signals, are referred to as word-level signals. The term "segment" denotes a group of contiguous bits, and can refer to an entire word, or parts of a word.

The read and write nodes are used for modeling memories. The semantics for a read node specify that for a read node of width w, the node returns the result of projecting out the bits at location addr*w ... (addr+1)*(w−1) from the bit vector op in its argument. For a write node having a data operand of width w, the write node returns the bit vector which would result from overwriting the region addr*w ... (addr+1)*(w−1) of the bit vector op in its argument with the data in its argument. The address space of the read and write nodes need not be restricted in any particular fashion. Out of bounds reads return nondeterministic values for nonexistent bits. Out of bounds writes do nothing. Dedicated "memory" register nodes, or restrictions on what signals read and write nodes can be applied to, are not necessary. Thus, RTL memory designs can be modeled as bit vector registers just like any other nodes. By appropriate use of control logic, together with multiple read and write nodes, the DAG in this example supports arbitrarily complex memory interfaces with large numbers of read and write ports. Moreover, by nesting reads, writes and other nodes, complex policies can be implemented on update and read orders resulting from same-cycle reads and writes.

Returning to FIG. 3, the input netlist is traversed to identify the remodellable memories and the read and write nodes of the memories (block 301). A remodellable memory is a memory that can be extracted using this technique. Basically, a remodellable memory in one practical implementation can be limited to those in which all of the slots are addressed in a uniform way, which only communicate with the rest of the design in such a way that another implementation easily can be substituted, and have a next state function of the particular simple structure. More formally, in one implementation given a register variable mem, the set of memory nodes, labeled "pure memory nodes" for mem, can be recursively defined as follows:

1) the node mem is a pure memory node for mem;
2) write($op^k$, $addr^j$, $data^j$) is a pure memory node for mem of $op^k$ is a pure memory node for mem;
3) mux($sel^1$, $optrue^k$, $opfalse^k$) is a pure memory node for mem if $optrue^k$ and $opfalse^k$ are pure memory nodes for mem.

The set of pure read nodes for a state variable mem is comprised of all netlist read nodes read($op^i$, $addr^j$) for which $op^i$ is a pure memory node for mem. Also, the set of write nodes for mem is comprised by all netlist nodes write($op^k$, $addr^j$, $data^j$) for which $op^k$ is a pure memory node for mem.

Given this terminology, a remodellable memory can be defined as a register state variable mem that fulfills the following requirements:

1) all read and write nodes that have mem in their support read and write data of the same width w using address nodes of the same width a. Moreover, the bit width of mem is an integer multiple m of w, and $2a \leq m*w$ so that all memory accesses occur inside the memory.
2) mem is either initialized to a Boolean constant 0000 . . . 0, 1111 . . . 1, or another determinant initialization value.
3) the next state function for mem is a pure memory node for mem and no other next state function is a pure memory node for mem.
4) every fanout path from mem is made out of a sequence of pure memory nodes terminating either in (1) the next state node for mem, or (2) a pure read node.

The first requirement ensures that the memory is treated as a bit vector of slots that are read and written in a uniform way. The second requirement ensures that all of the slots have the same initial state, which guarantees that the slots selected for representation in the updated netlist all have the same initial state. The remaining requirements ensure that the memory register only occur in the fanin of other state registers and outputs through read nodes, and that the next-state function for the memory is a simple multiplexer tree that chooses between different write nodes updating the memory.

The definition of remodellable memories utilized in this description provides a balance between being able to cover most interesting memory implementations, while being simple enough to provide relatively straightforward memory abstraction algorithms. Other types of memory can also be remodeled with suitable processing to account for exception conditions.

Given a netlist encoded as a word-level DAG, a straightforward linear traversal algorithm can be used to extract the set of remodellable memories, and compute their associated sets of read and write nodes.

Returning again to FIG. 3, once the remodellable memories have been identified along with their sets of read and write nodes, the memory is remodeled to reduce the number of memory slots represented, to those slots that are needed to satisfy a specified property of interest, such as a safety property or set of safety properties, as described in more detail below (block 302).

Next, word level net list reduction processes are executed that reduce the bit widths of the data paths in the net list (clock 303). This process is described in more detail below in connection with Figures The reduced netlist is then processed to determine whether the circuit design satisfies the specified property, or a more rigorous model checking can be executed (block 304). As mentioned below, the model checking on a particular reduced netlist can be implemented as part of the abstraction refinement loop in representative embodiments. Also, the reduced netlist can be processed in a wide variety of tools, including tools operating within a transformation-based approach to sequential system verification.

Figure 4:
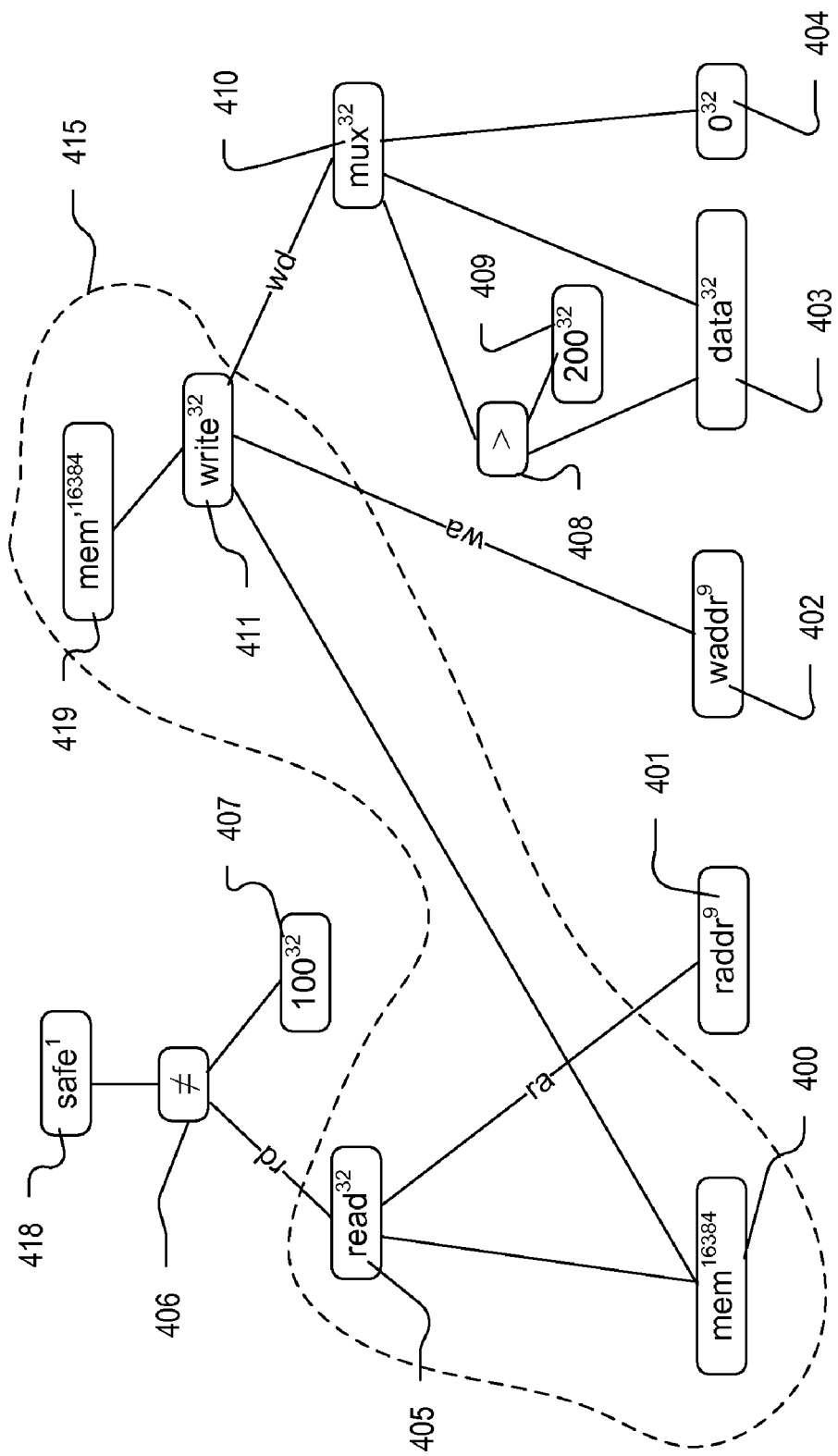
FIG. 4 is a representative example of a netlist implemented as a directed acyclic graph including a memory and plurality of nodes.

FIG. 4 illustrates an example netlist implemented in a DAG form including a circuit design containing memory. At the bottom of the DAG, the netlist includes mem$^{16384}$ which is the current state node 400 for the memory having a width of 16384 bits, a read address node raddr$^9$ 401 of width 9, a write address node waddr$^9$ 402 with 9, a data node data$^{32}$ 403 of width 32, and a constant node $0^{32}$ 404 of width 32. The top of the DAG includes the output node safe$^1$ 418 of width 1, and the next state node mem'$^{16384}$ 419 for the memory. A read node 405 produces an output by reading the memory node 400 using the address at node 401. A comparator node 406 compares the output of read node 405 with the constant $100^{32}$ stored in node 407.

The > operator node 408 compares the contents of the data node 403 with the contents of the constant $200^{32}$ in node 409. The result of the operator in node 408 is applied as the selector input to a multiplexer 410. The multiplexer 410 selects the contents of the data node 403 when the output of the node 408 is true, or the constant $0^{32}$ from node 404 when the output of node 408 is false. A write node 411 writes the next state register 406 for the memory node 400, at the address supplied in the write address node 402 using the data provided at the output of the multiplexer node 410.

Thus, at each clock cycle, the system reads the content of a slot at address raddr from mem. It also writes the input data to the slot at address waddr if the data is greater than 200, else it writes zero. The property that is implemented is a safety property, requiring that the value read from mem is never equal to 100. Clearly this is true for any execution trace in this simple system. Also, this statement can be proven by reasoning about the contents over time of a single slot in the memory, that is the last slot read.

The circuit modeled in FIG. 4 can be conceptually partitioned into two parts. The first part (enclosed by dashed line 415) contains the large memory mem, and communicates with the rest of the design through two inputs and two outputs: a nine bit wide write address port wa between nodes 402 and 411, a 32-bit wide write data port wd between nodes 410 and 411, a nine bit wide read address port ra between nodes 401 and 405, and a 32-bit wide read data port rd between nodes 405 and 406. The second part of the circuit of FIG. 4 is the balance of the circuit.

Figure 5:
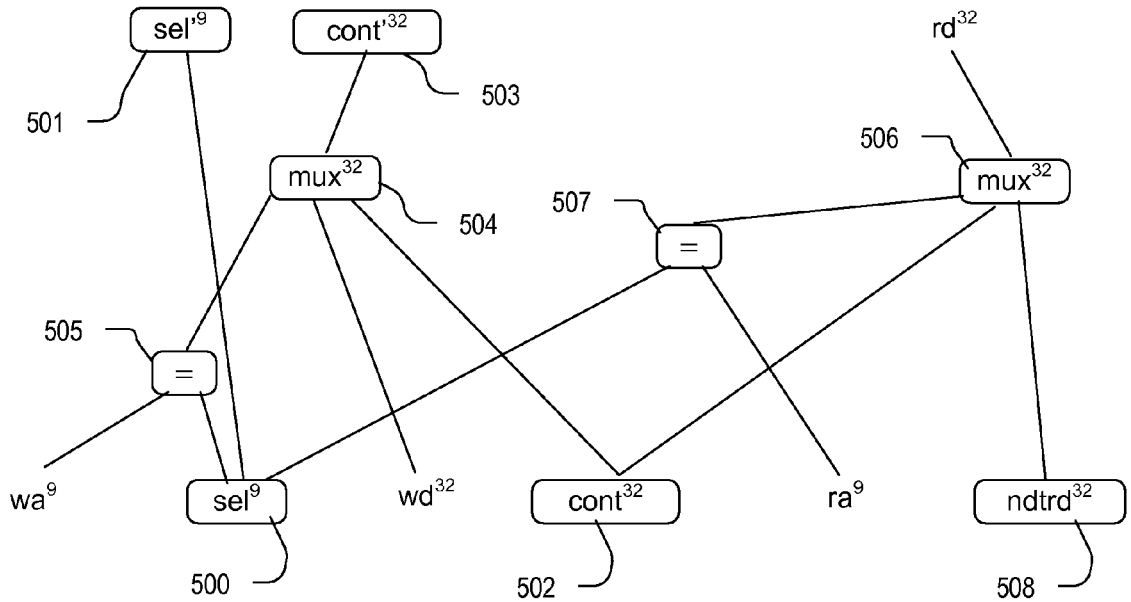
FIG. 5 illustrates an abstraction of the circuit design shown in FIG. 4.

The memory shown in FIG. 4 can be abstracted as shown in FIG. 5, by substituting the 16384 bit wide, current state and next state memory nodes, with current state and next state versions of two registers: a sel node 500 and sel' node 501, nine bits wide, which identifies a represented slot in the memory such as by containing the address for the slot, and a cont node 502 and cont' node 503, each 32-bits wide, which act as the container for the contents of the represented slot. The slot to be represented in this way is chosen during initialization of the circuit, and stays the same during subsequent system execution. The node sel in this implementation has an unconstrained initial state, and a next state function that just propagates the current state value to the next state node 501. The register cont 502, 503 is initialized to the specified initialization value for the memory slots, such as all zeros.

Write node from the implementation in FIG. 4 is replaced by multiplexer 504, which updates the next state value for cont with the data on the write data port wd$^{32}$, if the contents of the sel node 500 equal the address on the write address port wa$^9$ as indicated by the output of comparator 505; else, it propagates the current state node 502 of cont to the next state node 503. The read node from the implementation FIG. 4 is replaced by multiplexer 506, which supplies the read port rd$^{32}$ with the contents from the current state node 502 for cont, if the contents of the sel node 500 equal the address on the read address port ra$^9$ as indicated by the output of comparator 507; else it supplies non-determinate data from a non-determinate read node 508.

Figure 6:
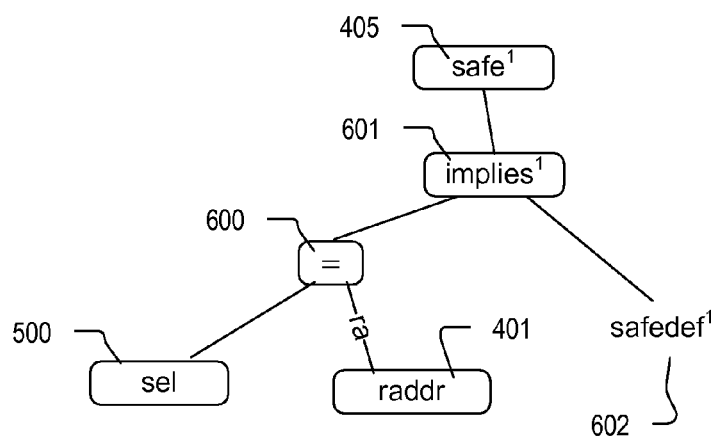
FIG. 6 illustrates an implementation of a safety property for use with the abstraction of FIG. 5.

In addition, the netlist is updated to change the definition of correctness so that the property of interest is checked only when the address that is read from the current clock cycle is the address of the represented slot indicated by the sel node 500, in this example as shown in FIG. 6. Thus, the output safe in node 408 is fed by the output of the implication operator 601. The implication operator 601 only checks the output of the original safe definition circuitry safedef$^1$ 602, if the node 401 feeding a read address port ra matches the contents of the sel node 500, as indicated by the output of node 600. This implementation prevents a spurious counter-example introduced by the abstraction of the memory which occurs (1) where the value of raddr in the final cycle is different from the value chosen as the initial value for sel and (2) the contents of ndtrd 508 are 100. In this counter-example, the slot chosen for representation by the initialization of sel is not in sync with the address that is read in the counter-example. This results in an erroneous read that could mistakenly trigger a false output for the safe definition. By re-implementing the verification condition as shown in FIG. 6, the possibility of an erroneous false indication is eliminated.

In the example just described with reference to FIGS. 4-6, the memory was abstracted over the current value of the slot identified by the raddr node 401. This worked well for that example. However for many systems, memory accesses from a number of previous time instances or cycles have to be performed correctly to guarantee that correctness of the system can be checked in the current cycle. For example, in order to check that a complete multi-part message is always forwarded correctly, then a safety definition may require performance of a sequence of reads correctly over time. In order to handle these types of systems, the remodellable memory is abstracted in this procedure over a set of abstraction pairs ($v_i$, $d_i$), where $v_i$ is a signal, such as the raddr node 401, containing a read address of a slot to be represented, and $d_i$ is an integer time delay indicating a number of cycles preceding the current cycle. The node $v_i$ and all abstraction pairs must have the same width as the address nodes of the reads and writes operating on the memory. In the example described with reference to FIGS. 4-6, the memory was abstracted over a single abstraction pair {(raddr9, 0)}.

Figure 7:
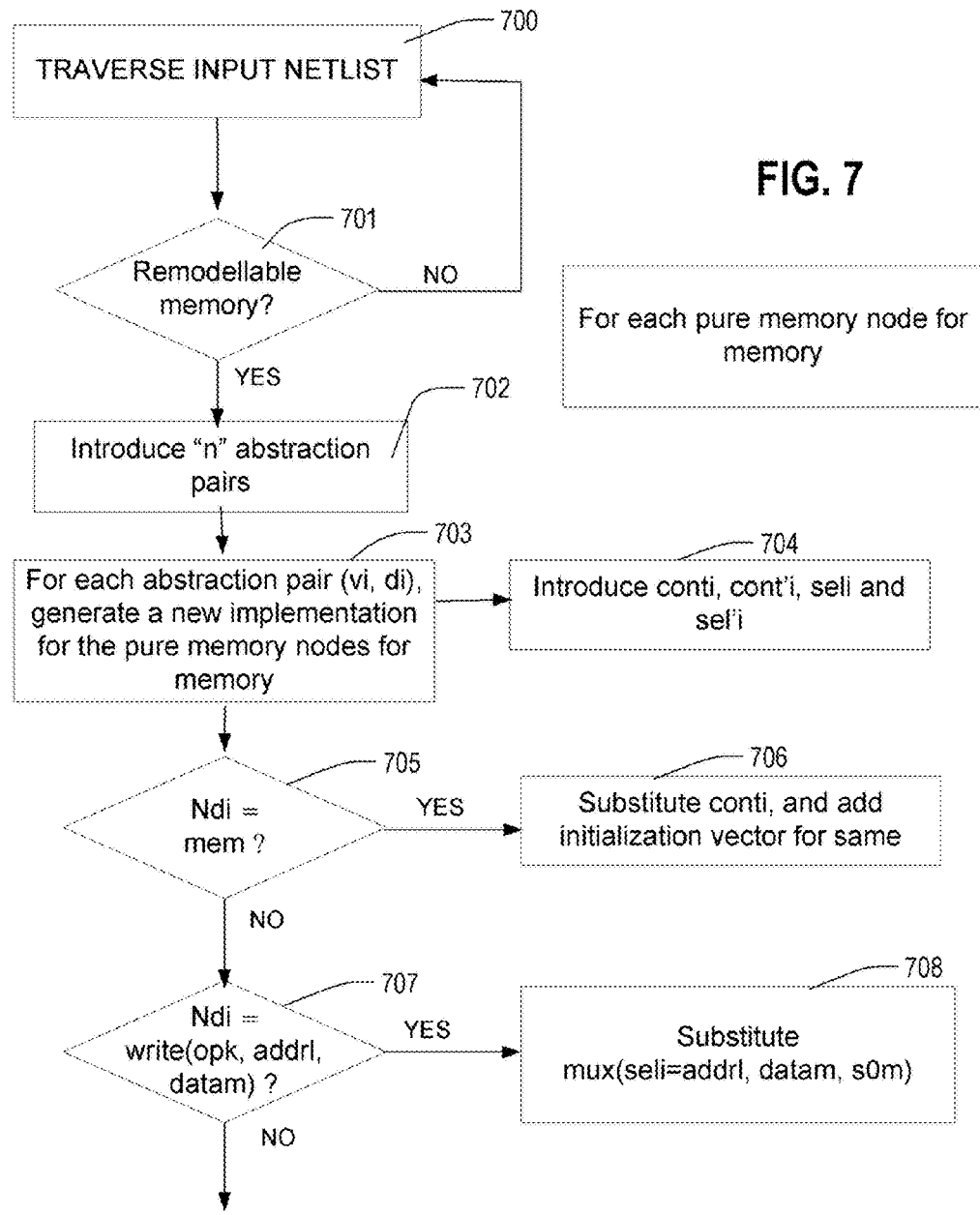
FIGS. 7-8 show a more detailed flow chart of a process for reducing the size of a data structure representing a circuit design by abstracting memories.

The set of abstraction pairs to be utilized in a particular implementation of a reduced netlist is identified by the processes described below. Assuming that abstraction pairs have been identified, FIGS. 7 and 8 provide a flow chart for introducing represented slots, re-implementing read nodes, and modifying the verification condition to produce an updated netlist.

The process involves traversing an input netlist to identify a remodellable memory (block 700, block 701). For each remodellable memory, a number "n" of abstraction pairs is introduced (block 702). Each abstraction pair $(v_i, d_i)$ is processed as indicated at block 703, by introducing the current state variable $sel_i$ for $(v_i, d_i)$ with an uninitialized initial state function, and a next state function that just propagates the previous state value as described above to the next state variable $sel'_i$ (Block 704). The $sel_i$ register will contain the concrete slot number that is represented by this abstraction pair during system runs. In addition, the container register $cont_i$ and its next state register $cont'_i$ are introduced for the represented slot. The container register is initialized in a way that corresponds to the initialization of the original mem node. The function driving the next state register cont' is taken as the node in the updated netlist for the next state function of the identified memory. This is possible because the definition of a remodellable memory in this example guarantees that the next state function for mem is a pure memory node for mem.

Next, the pure memory nodes in the netlist for the identified remodellable memory mem are replaced by substitute nodes. As indicated at block 705, if the node is the identified memory, then the container register ($cont^i$) and initialization vector corresponding to the current abstraction pair are used as substitute nodes for the memory (block 706). If the node is a write node of the form write($op^k$, $addr^j$, $data^m$) (block 707), it is replaced by the logic mux($sel^1$=$addr^j$, $data^m$, s0), where s0 represents the node corresponding to $op^k$ in the updated netlist, such as the container register cont in FIG. 5 (block 708).

Figure 8:
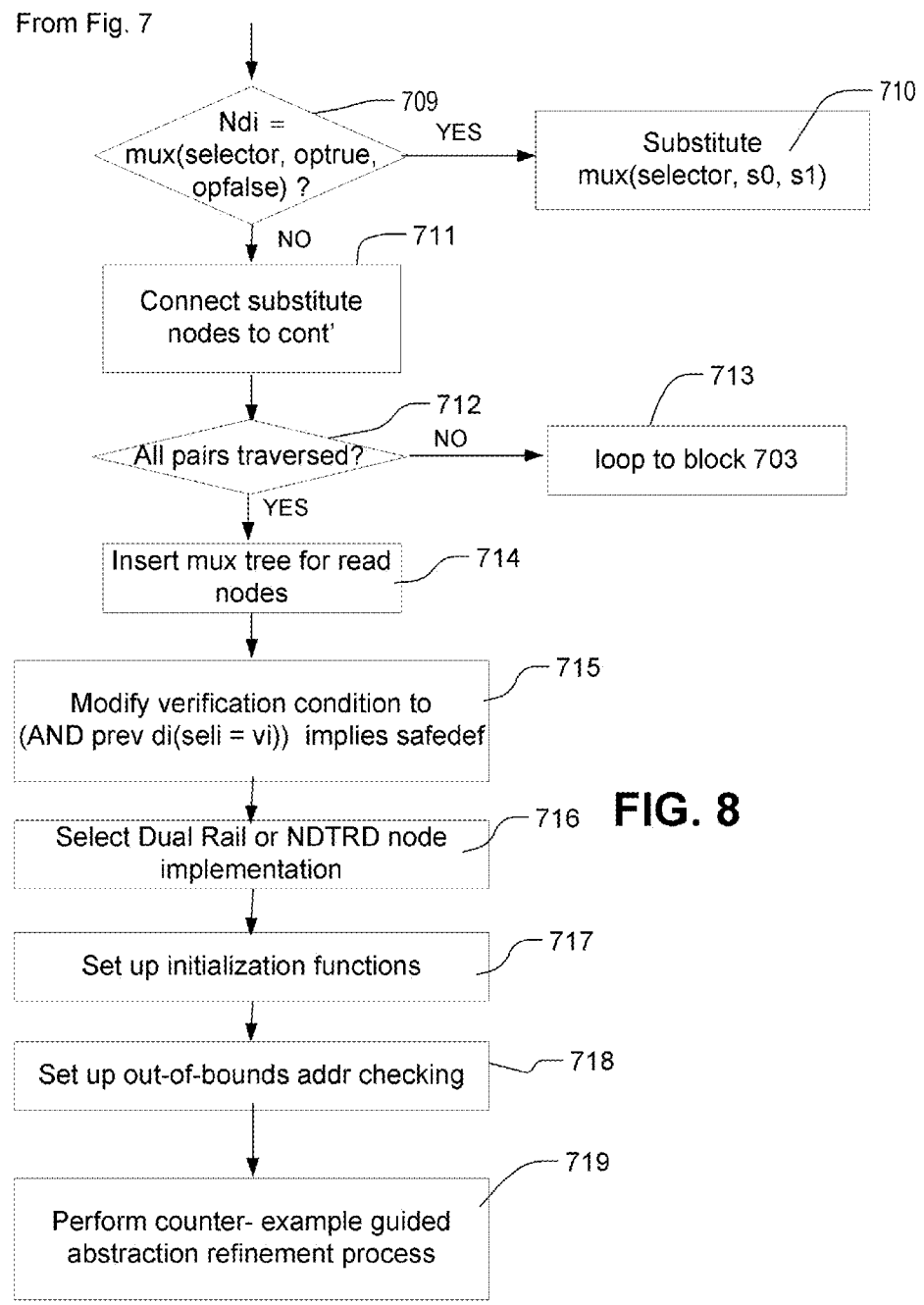

Proceeding to FIG. 8, if the node is a multiplexer of the form mux(selector, optrue, opfalse) (block 709), it is replaced by the logic mux($sel^i$=$addr^j$, s0, s1), where s0 and s1 are the nodes representing optrue and opfalse respectively in the updated netlist (block 710).

Next, the substitute node is connected to the next state container register $cont'^i$ for the corresponding slot, such as node 504 is connected to cont' 503 in FIG. 5 (block 711). The process traverses the abstraction pairs in this manner until they are all re-implemented in the updated netlist (block 712, block 713).

Next, read nodes are re-implemented. If the node has the form read($op^k$, $addr^j$), where $op^k$ is replaced by a represented slot in the memory for an abstraction pair, then the read node multiplexer tree is modified to include this represented slot (block 714). The implementation of the multiplexer tree for read nodes is described below with reference to FIG. 10.

After processing the nodes corresponding to the identified memory, the verification condition is modified (block 715) so that the property is only checked when the signals $v_i$ identified by the abstraction nodes have had the selected values at the appropriate previous time instances $d_i$. One technique for implementing verification condition is to define a temporal formula $prev^{di}(s)$, that is true at time t in the execution of the system precisely if $t \geq d$ and a combinational signal s evaluates to true at time t−d. Assuming that there n abstraction pairs $(v_i, d_i)$ for the signal s, the new safe output can be generated by synthesizing a checker for the temporal formula:

$$\left( \bigwedge_{i=0}^{n-1} prev^{di}(sel_i^t = v_i^t) \right) \rightarrow safedef$$

where safedef is taken to be the combinational node feeding the old safe output. In the example described in FIG. 4, safedef would be the node 406 which is true when the data on the read data port rd is not equal to 100. This checker can be implemented in a simple manner using a number of register chains that delay previous values of some netlist node comparisons. An example is described below with reference to FIG. 10. It is noted that the identified memory mem is a remodellable memory. Therefore it can only occur in the fanin of other state variables through read nodes. The updated netlist re-implements all the read nodes necessary for satisfying the safety condition. Therefore, the netlist can be reduced by removing the original memory mem and all the logic that depends on it in the manner described above.

Blocks 716-718 illustrate additional steps involved in re-implementing the netlist for some embodiments of the process. These nodes are inserted in the flow chart to reflect that they are a part of examples of the process that can be used, rather than to indicate an order in which the processed are executed. First, as mentioned above, the register ndtrd is introduced for all read nodes in one approach. An alternative implementation can apply dual rail encoding, adding an extra bit to the registers in the signal path which operates as a flag to indicate whether the contents are non-determinate. The netlist can be evaluated to determine which approach is more efficient for a given circuit design implementation, and that technique chosen (block 716). This can be done by executing the re-implementation loop (e.g. nodes 702-715) once using dual rail encoding, and once using non-determinate data nodes, and comparing the results. Also, initialization functions can be set up for various nodes, including the container nodes for the memory that are not all zeros or all ones, relaxing the definition of the remodellable memory to allow non-uniform initialization (Block 717). Finally, definition of remodellable memory can be relaxed to allow unconstrained address widths, and in such cases the updated netlist can be further updated by adding out-of-bounds address checking for read and write nodes (block 718).

Once the updated netlist has been generated, then the process proceeds to perform a counter-example guided abstraction refinement process to determine whether additional abstraction pairs need to be added (block 719). Details of a representative counter-example guided extraction refinement process are described with reference to FIG. 11.

Figure 9:
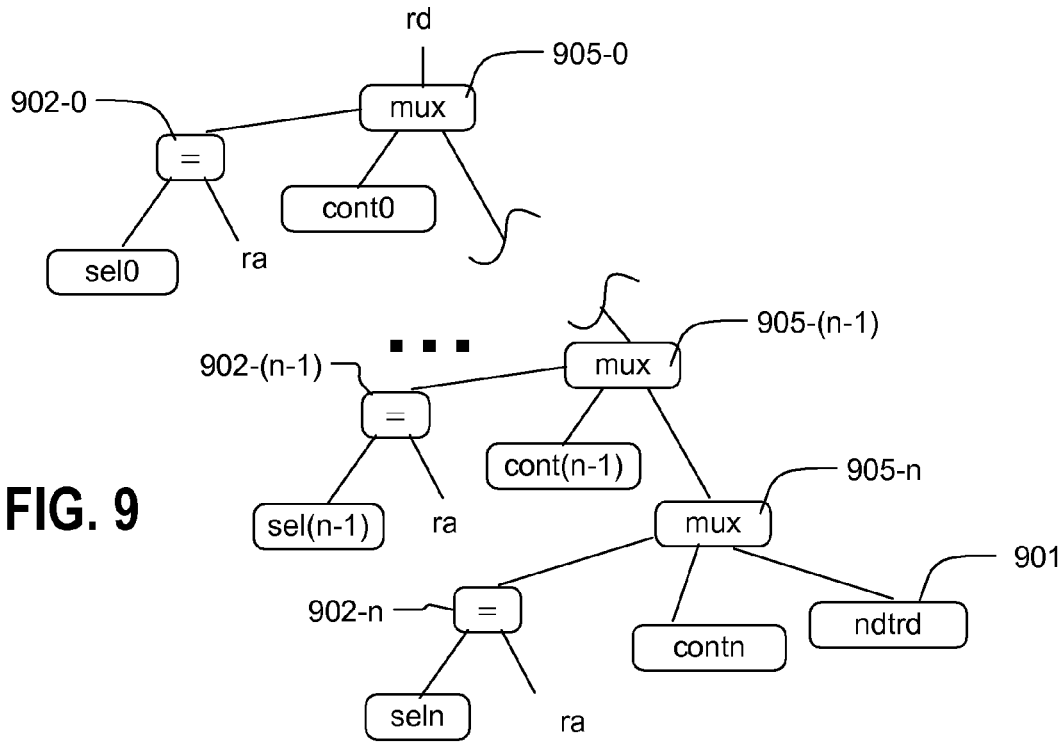
FIG. 9 illustrates an implementation of a multiplexer tree for read nodes.

As mentioned above with reference to block 714, pure read nodes are represented in the updated netlist by a multiplexer tree of the form shown in FIG. 9. The multiplexer tree shown in FIG. 9 returns the contents of the first selected slot with an address matching the address on the read address port ra. If the address does not match any selected slot, then a nondeterministic value is read from the environment at the input node ndtrd 901. The multiplexer tree includes multiplexers 905-0 to 905-n, and receives as input the nodes identifying represented slots sel0 to seln, which are compared with the address on the read address port at comparator nodes 902-0 to 902-n. The outputs of the comparator nodes 902-0 to 902-n, are used as selector inputs on corresponding multiplexers 905-0 to 905-n. Also, the multiplexer tree receives as input the substitute nodes for the represented slots cont0 to contn. Multiplexer 905-0 selects the contents of cont0 if the output of comparator node 902-0 is true, else selects the output of multiplexer 905-1 (not shown). The last multiplexer 905-n in the tree selects the contents of contn if the output of comparator node 902-n is true, else selects the value in ndtrd node 901.

Figure 10:
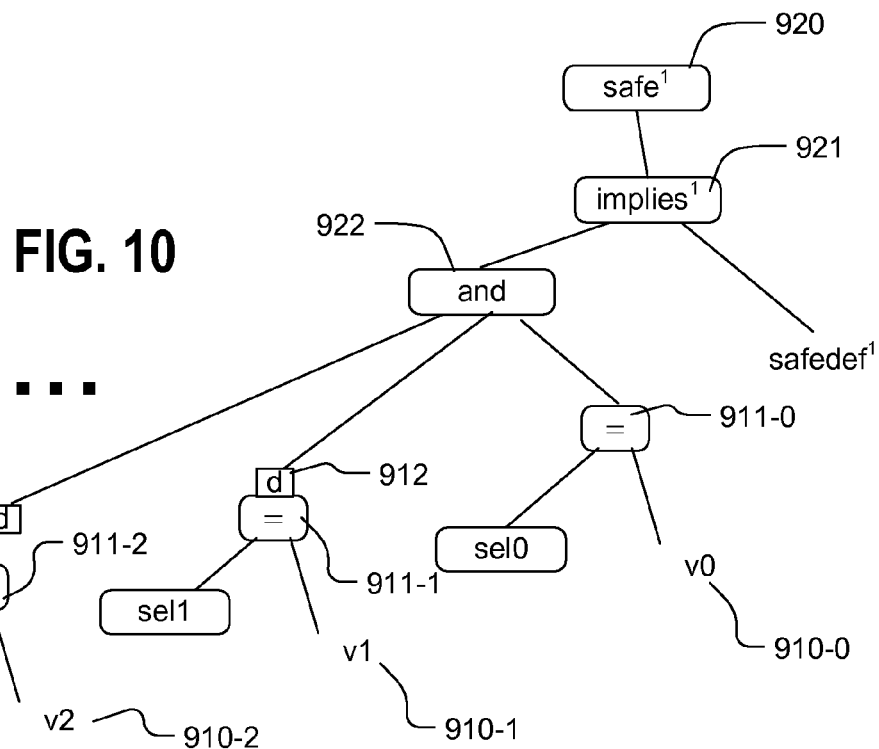
FIG. 10 illustrates an implementation of a safety property for use with an updated netlist including a plurality of abstraction pairs.

FIG. 10 illustrates a re-implementation of a verification condition as mentioned above with reference to block 713. In this example, the "safe" output 920 is driven by the implication operator 921. The implication operator operates to only check the output of the safety definition safedef[1], when the output of the AND node 922 is true. The AND node 922 is driven by a set of comparators over the abstraction pairs having their outputs delayed by the appropriate delay times indicated in the abstraction pairs. Thus, the value $v_0$ from abstraction pair $(v_0,d_0)$ 910-0 is compared with the sel0 node which identifies the slot represented by the abstraction pair. Because the delay value $d_0$ is zero indicating that the abstraction pair corresponds to a slot read in the current cycle, the output of the comparator 911-0 is applied to the AND node 922 without delay. The value $v_1$ from abstraction pair $(v_1,d_1)$ 910-1 is compared with the sel1 node which identifies the slot represented by the abstraction pair. Because the delay value $d_1$ is one indicating that the abstraction pair corresponds to a slot read in a cycle preceding the current cycle by one, the output of the comparator 911-1 is applied to the AND node 922 with a one cycle delay through register 912. The value $v_2$ from abstraction pair $(v_2,d_2)$ 910-2 is compared with the sel2 node which identifies the slot represented by the abstraction pair. Because the delay value $d_2$ is two indicating that the abstraction pair corresponds to a slot read in a cycle preceding the current cycle by two, the output of the comparator 911-2 is applied to the AND node 922 with a two cycle delay through registers 913 and 914. In FIG. 10, the delay registers are simplified to avoid crowding the drawing. In a representative system, the delay 912 is implemented by establishing a node d1 having a next state node d1'. The output of comparator 911-1 supplies node d1' in the current cycle. The contents of register d1 are supplied as input to the AND node 922. Likewise, the delays 913 and 914 are implemented by creating registers d1 and d2, where the next state register d1' is driven by the output of comparator 911-2, the current state register d1 drives the next state register d2', and d2 is supplied as input to the AND node 922.

Figure 11:
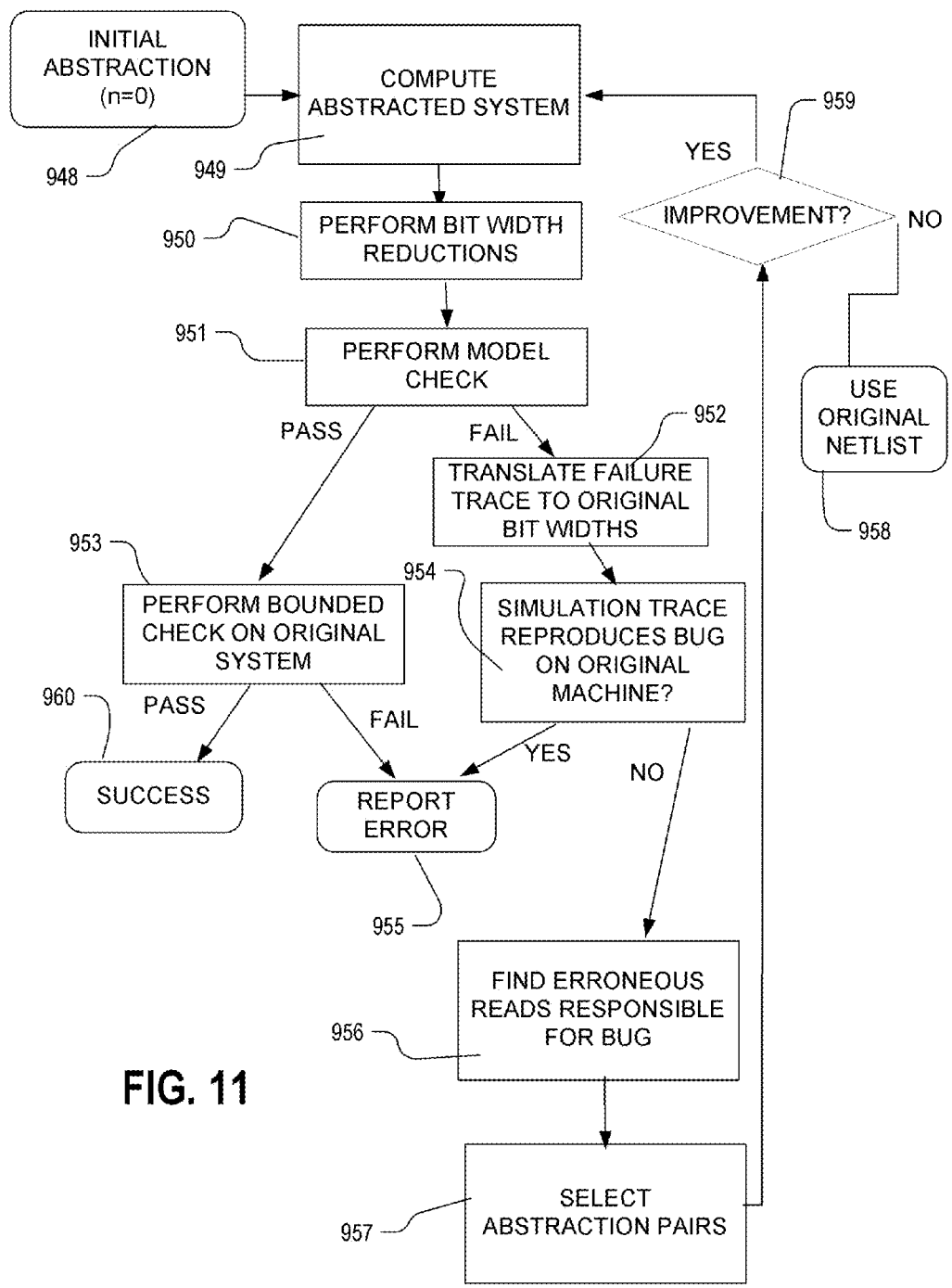
FIG. 11 is a block diagram of a computer implemented, counter-example guided, abstraction refinement loop.

FIG. 11 illustrates a process for finding abstraction pairs for a particular design problem. One alternative approach would be to rely on the user to provide an identification of a set of abstraction pairs as an input to the process. However, an automatic approach as shown in FIG. 11 is preferred. Thus, for the process of FIG. 11, we maintain a current set of abstraction pairs for each remodellable memory in the design. The set of abstraction pairs for each remodellable memory is monotonically growing in the iterative process shown in FIG. 11. The process provides an initial abstraction in which no memory slots of remodellable memories are represented, having zero abstraction pairs (block 948). In this initial abstraction, a system is represented where each read from a memory returns a nondeterministic result. Given the initial abstraction, an abstracted system is computed providing an updated netlist using the procedures described above with respect to FIGS. 7 and 8 for example (block 949). BIT WIDTH RED (Block 950). The updated netlist is applied to a bit level model checking routine, such as typically utilized in the art to check correctness of the design (block 951). If the property being checked holds on the updated netlist, the abstraction process proceeds to a bounded check on the original system (block 953). In this step, the bounded correctness of the original system is checked, bounded by the number of cycles corresponding to the largest delay value in the set of abstraction pairs in the updated netlist, using a standard SAT-based bounded model checking program. The system is declared correct if this check passes (block 960). If the bounded check of the original system fails, the original system is faulty and an error is reported (block 955).

If the model check at block 951 detects a counter-example on the abstracted system represented by the updated netlist, then the procedure attempts to refine the abstraction. The inputs of the abstracted system are a superset of the inputs of the original system. So the counter-example can be replayed by a simulation on the original system using the inputs and state variables determined from the trace indicating failure in the updated netlist. Thus, the failure trace in the netlist is translated back to the original bit widths (block 952), and the original machine is simulated (block 954). If the bug is detected in the simulation, then an error is reported to the user (block 955). If the bug does not occur in the simulation, it is necessary to refine the abstraction set to remove the error trace.

Because the only difference between the original and abstracted system that could introduce a spurious counter-example is the memory encoding, some abstracted read node at some time instance must return the contents of an unrepresented slot. By inspecting the simulation run on the original system and comparing the values of the pre- and post-abstraction read nodes, erroneous reads over time can be identified in the execution of the abstracted system (block 956).

Not all of the erroneous reads will have an impact on the checked property. The procedure determines a minimal set of reads and associated time points by initially forcing correct values for all erroneous reads in the abstract system simulation, and iteratively shrinking this corrected set in a greedy way until a local minimum of forced reads that still removes the error in simulation is determined.

Given a set of erroneous reads to be corrected, and the time distances from the error cycle in which the erroneous reads occurred, an abstraction signal must be identified for each time point. The abstraction signals can be chosen using a heuristic, such as the following: if the fraction of read nodes for a memory relative to the number of memory slots is smaller than some empirically selected value, such as 20%, then the address signals of the failing read at their corresponding time distance from the final cycle, are used to create new abstraction pairs. However, if the fraction of read nodes for a memory relative to the number of memory slots is greater than the selected value, then the procedure searches for a register that (1) is of the same size as the address width of the memory, (2) is in the cone-of-influence of the memory, and (3) contains the address value being read by the erroneous read node at the time instances that the read is performed. Upon finding a register meeting these criteria, the identified register node is used to create a new abstraction pair. In circuit designs having a large number of read nodes, in order to successfully abstract the memory, a register entry that contains the identified slot should occur somewhere else in the design. This assumption is crucial for dealing with certain types of memories, such as content addressable memory where every entry in the memory is read in each cycle, but only a small number of reads at a given time matter.

For example, assume a counter-example 15 cycles in length for an abstracted version of the design with a single remodellable memory with 32 slots and two read nodes. If a read node of the form read (mem, $raddr_i$) needs to have a correct value at cycle 13, which is one time step before the failure cycle, in order to remove the bug trace, an abstraction pair ($raddr_i$, 1) is added to the current abstraction set. However if the memory had 28 read nodes, then the procedure would search for a register reg, that at cycle 13 contained the concrete address for which the read failed, and the found register would form the basis of a new abstraction set (reg, 1). If no such register exists, then the procedure reverts to the original un-abstracted modeling of the memory.

After the new set of abstraction pairs has been selected at block 957, the process performs the step of evaluating whether progress is being made (block 959). Of course this step, along with other steps in the process illustrated in FIG. 11 can occur in any appropriate order. For example, if the abstracted size determined after block 951 for example, is greater than 75% of the size of the original netlist, then the procedure can branch to use the original netlist (block 958). In an alternative, at block 959 the system may check to determine whether the processing has exceeded a time limit, or exceeded a pre-specified number of loops to indicate whether improvement is being achieved.

In any event, the new set of abstraction pairs is added to the abstracted system and such modifications needed to accommodate the new set of abstraction pairs are completed (block 951). The procedure iterates around the loop shown in FIG. 11 until the model checking succeeds (block 960), an error is reported (block 955), or decision is made to use the original netlist (block 958).

Figure 12:
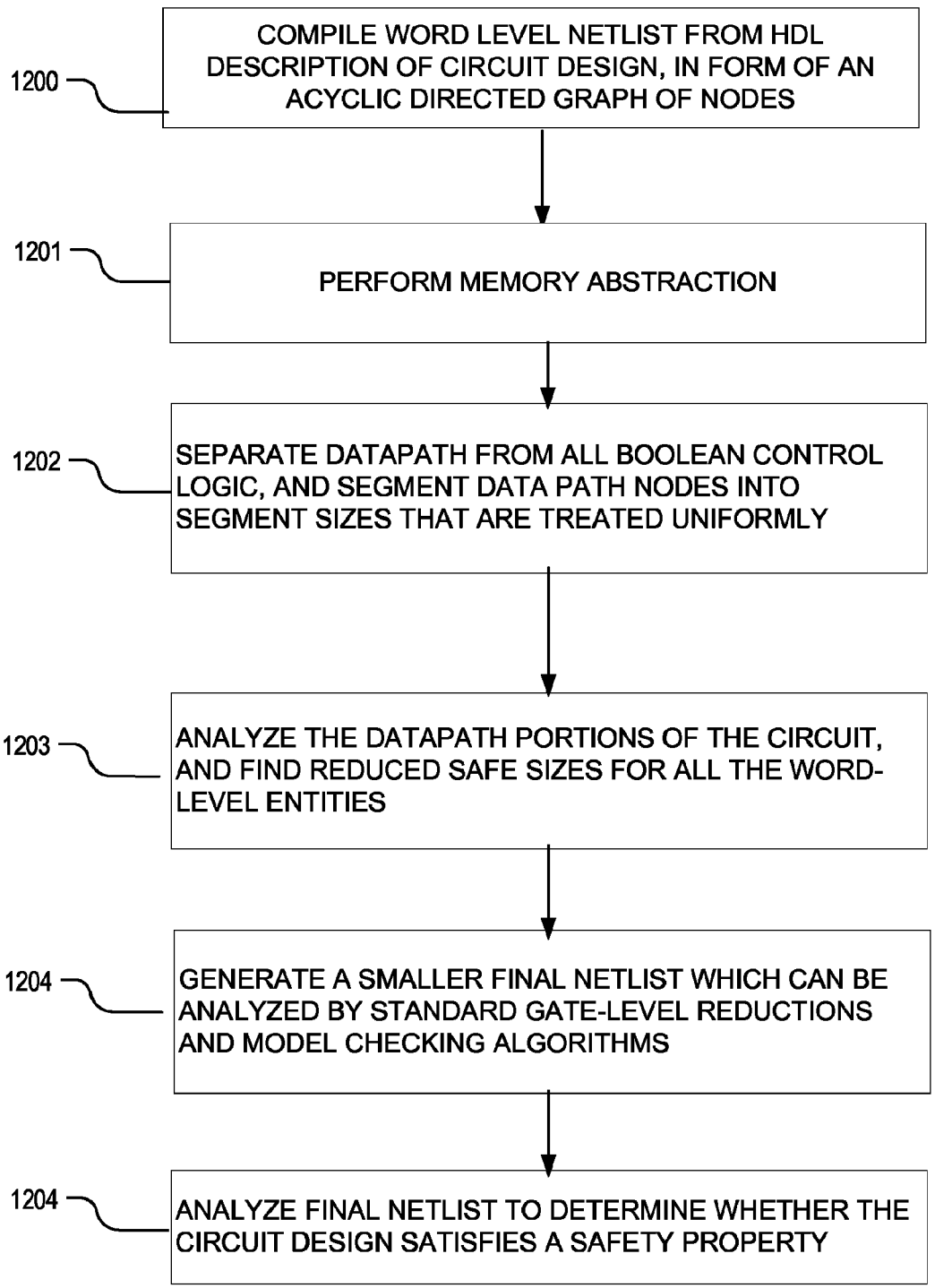
FIG. 12 is a simplified flow chart for a process for reducing the size of a data structure representing a circuit design, and performing a verification process using the reduced data structure.

FIG. 12 is a basic flowchart for a process for performing a verification step for a circuit design that includes operating on a reduced netlist. In the process of FIG. 3, a word-level netlist including a plurality of nodes is compiled from a high-level description language description of a circuit design, preferably in the form of a directed acyclic graph of nodes (block 1200). A standard front end flow takes a Register Transfer Level (RTL) description expressed for example in Hardware Description Language (HDL), supplemented with the definitions of user constraints, properties and other information, and produces the implicitly clocked DAG representation described in detail below. A standard front end flow is used which compiles a circuit design into netlists by processing a hardware design with properties and constraints into a plurality of nodes representing combinational logic over a set of unconstrained inputs I, state variables S and constants. The top of the resulting plurality of nodes contain next-state variables S' and single bit outputs O. The properties which can be verified using this technology include all properties whose failure is signaled by some output assuming the value "false", including safety properties. A safety property is a subclass of properties of circuit design, which has the form that some output always holds (i.e., whose failure can always be shown by a finite trace). In addition, each state variable can be assumed to have a fully or partially unknown initial state in some embodiments.

The internal nodes in a graph compiled in this manner (as stated above) include the following:

```
node1 = not(node2)node1 = and(node2, node3)
node1 = arithOp(node2, node3), for arithOp being a member of {+, −, ...}
node1 = compOp(node2, node3), for compOp being a member of {less
    than, less than or equal to, equal to, not equal to, greater than or
    equal to, greater than}
node1 = mux(selector, node2, node3)
node1 = extract(x, node2)
node1 = concat(node2, node3, ...)
```

The "not" and "and" operators are bitwise operators in the sense that bit i of the result is generated by applying the Boolean operator to bit i of the input nodes. The "mux" node returns node2 if selector is true and node 3 otherwise. The "extract" node constructs a smaller bit vector by projecting out k bits from position (x) to (x+k−1) of its operand. Finally, the "concat" node forms a larger signal by concatenating its operands to form a larger bit vector. Earlier operands in the argument list to concat become higher order bits, so concat (01, 00) becomes 0100.

The select signal of mux and the output of comparison operator nodes are restricted to have a bit width of one. Such signals are said to be bit-level signals. Signals that are not bit-level signals, are referred to as word-level signals. The term "segment" denotes a group of contiguous bits, and can refer to an entire word, or parts of a word.

Returning to the flow chart in FIG. 12, block 1201 indicates that memory abstraction can be performed prior to the word level reduction, as mentioned above. In the example described herein, no read and write nodes are discussed. However, the extension of this process to them is straightforward, and described below.

Next, the plurality of nodes is analyzed to separate datapath nodes from control logic, and to segment the datapath nodes into segment sizes that are treated uniformly (block 1202). The segmented datapath portions of the circuit are analyzed to find reduced safe sizes for all word-level and segmented nodes (block 1203). A smaller final netlist is generated using the reduced safe sizes which can be analyzed by standard gate-level reductions in model checking algorithms (block 1204). The final netlist is analyzed to determine for example, whether the circuit design satisfies a safety property specified by circuit verification tools (Block 1205).

Figure 13:
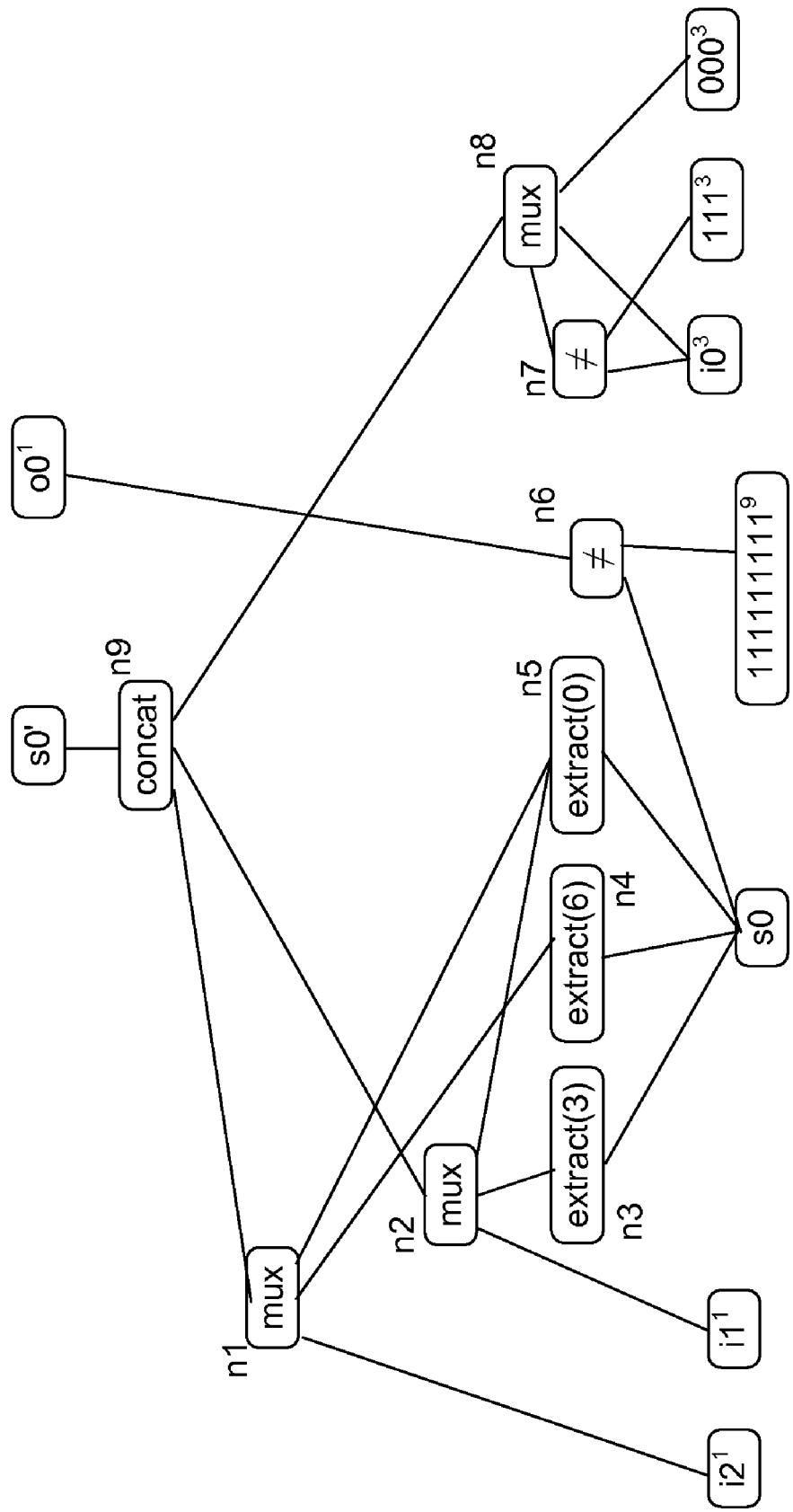
FIG. 13 is a representative example of a netlist implemented as a directed acyclic graph including a plurality of nodes.

FIG. 13 illustrates a netlist implemented as a directed acyclic graph, where top-level nodes include word-level (and/or bit-level) nodes representing circuit outputs (o0) and next-state variables (s0'), where bottom-level nodes include word-level (and/or bit-level) nodes representing inputs (i0, i1, i2), initial state variables (s0) and binary constant vectors (111111111, 111, 000), and where internal nodes include word-level (and/or bit-level) nodes representing operators (n1-n9). In FIG. 13, the superscripts shown adjacent to the node indicators represent widths of the nodes, where the width corresponds with the number of bits. The initial state for $s0^9$ is set during initialization to using an initialization vector $000000000^9$, and the property of interest is that output $o0^1$ is always true. The circuit generates the next state s0' for state variable s0 by concatenating three parts. The lowest part is a fresh input value i0, but only if it is not equal to 111 (otherwise it switches in 000). The other two segments are the result of either keeping the current 2 lower order segments (0 . . . 2) and (3 . . . 5) of s0, or swapping in the low order segment (0 . . . 2) of s0 with the upper order segment (6 . . . 9) of s0, depending on the value of two externally controlled inputs i1 and i2. Hence, the system is safe in that the output can never become false. Each node in the graph has an associated signal width k. At places in the present description, the nodes are annotated with a superscript to denote the signal width.

One can see that the circuit design represented in the structure shown in FIG. 13, or in a similar data structure, can be "bitblasted" into an equivalent bit-level netlist by splitting all the variables into single bit segments, and implementing the internal nodes in terms of Boolean, single bit logic. This would result in a netlist where all the signals have a width of one, and the internal nodes are Boolean operators. In order to provide a reduced, word-level netlist as described herein, selective bit blasting is performed by traversing the graph in a depth first manner, identifying segments of datapath nodes that treated uniformly and segmenting these nodes accordingly. All other operators are translated into bit-level constructs. Then, a reduced safe size for the segmented nodes is identified and an updated netlist is generated using the reduced safe sizes for the segmented nodes, and the bit-level constructs.

A technique for performing this analysis involves annotating each node in the graph with information on which of its segments are treated as word-level packages; that is, units of data that are treated uniformly. Analysis of this type to reduce formulas, rather than sequential systems as described here, is described in P. Johannesen, "*Speeding up hardware verification by automated datapath scaling,*" Ph.D. thesis, Christian-Albrechts-Universitat zu Kiel, 2002, which is incorporated by reference as if fully set forth herein.

Figure 14:
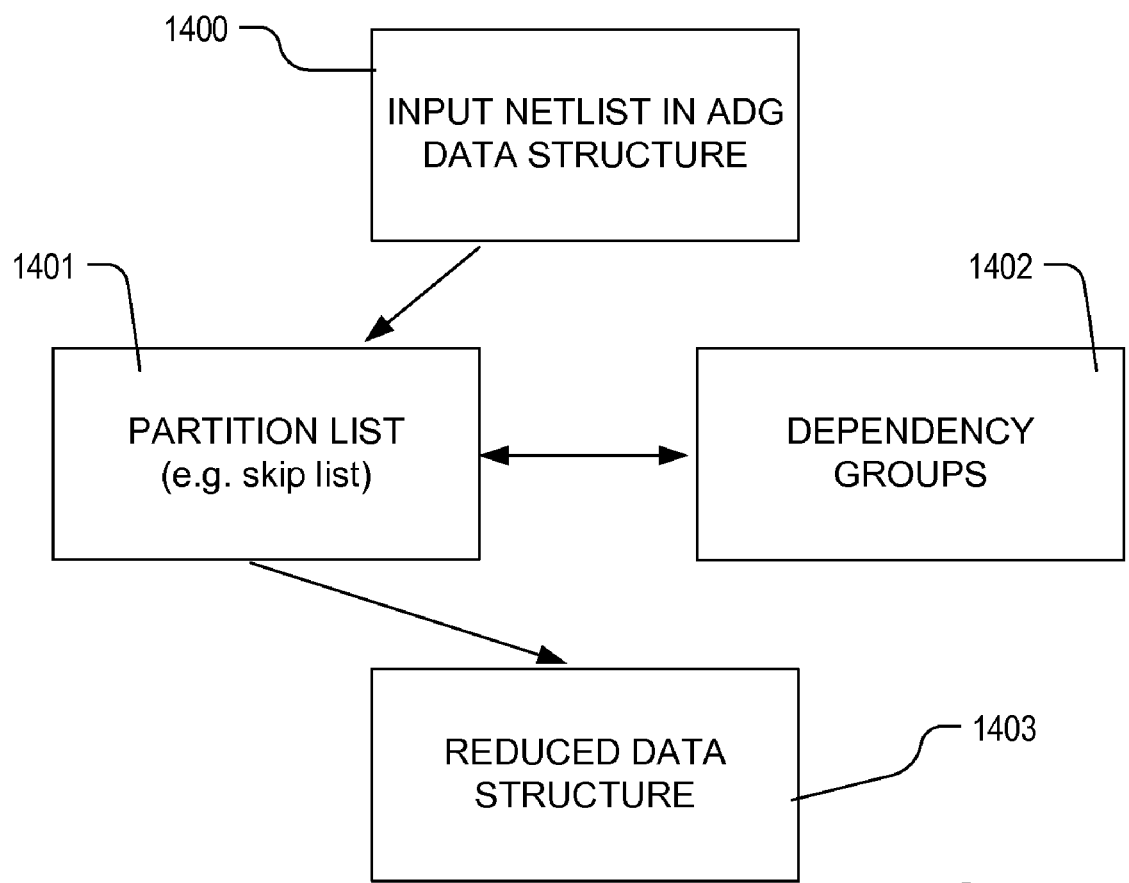
FIG. 14 is a simplified drawing showing data structures used in the process of FIGS. 9-13.

FIG. 14 illustrates a simplified data organization for use in a data processing machine performing the process, including the input data structure 1400 in which a circuit design is represented by a plurality of nodes arranged as a directed acyclic graph, a partition list 1401 containing segmentation information identifying the partitions in the nodes, a list 1402 of dependency groups for the segments in the partition list 1401, and a reduced data structure 1403 provided as output of the process. The partition list 1401 maintains a partition at each node into bit segments. For each bit segment of every node, a dependency class is maintained in list 1402 that includes segments of nodes that depend on the segment, or that the segment depends upon, and reduced data structure 1403 is processed as a result of the procedures described herein.

The data structures are processed using operations on dependency groups and intervals, including registerNode(n), split(n,j), mkCompatible(n1, n2, . . . ), bitblast(n) and MergeDepGps(n1, n1, . . . ).

The creation operator, registerNode(n) adds a node n, having a segment (0 . . . k−1) in the partition list, and constructs a singleton dependency group containing the segment (0 . . . k−1), assuming the node has k bits.

The refining operators split(n,j), mkCompatible(n1, n2, . . . ), and bitblast(n) perform the following functions:

1. split(n,j): This operator finds the segment dependency group for node n that contains the bit j. If the bit j falls internally to the segment interval i . . . k, so that i<j<k, then the dependency group is split into two new groups, the first containing the j−i first bits of each segment, and the other containing the remaining bits of each segment.

Figure 15:
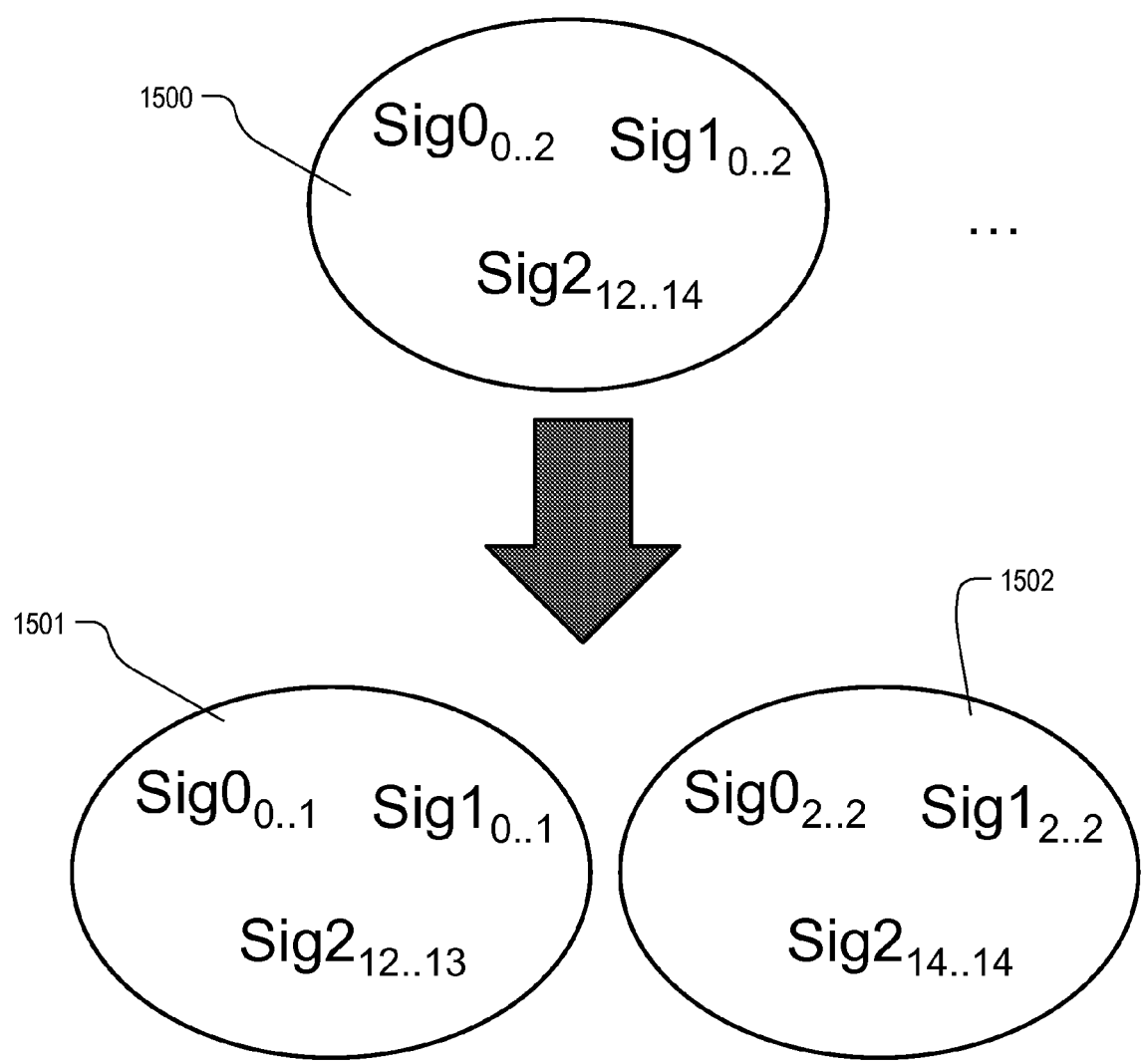
FIG. 15 illustrates an operation to split a partitioned node.

FIG. 15 illustrates the results of a split operation for the group 1500 on the location 1. Thus, the dependency group 1500 includes three segments having a width of three bits: Sig0(0 . . . 2), Sig1(0 . . . 2), Sig2(12 . . . 14). After the split (Sig0,1), dependency groups 1501 and 1502 result, where dependency group 1501 includes three segments having a width of two bits: Sig0(0 . . . 1), Sig1(0 . . . 1), Sig2(12 . . . 13); and the dependency group 1502 includes three segments having a width of one bit: Sig0(2 . . . 2), Sig1(2 . . . 2), Sig2(14 . . . 14). One can transfer the segmentation of a first node to a target node, by using the split to introduce cuts in the target node at all positions where there are cuts in the first node.

2. mkCompatible(n1, n2, . . . ): This operator applies the split operator to its operands until their segmentations match. FIG. 16 illustrates the results of mkCompatible (s1, s2), where before the operation node s1 includes two segments, including a single bit segment 0 . . . 0 and a 31 bit segment 1 . . . 31, while node s2 includes two segments, including a two bit segment 32 . . . 33 and a 30 bit segment 34 . . . 63. In order for the segmentations to match, the 31 bit segment in node s1 must be split at location 1, and the two bit segment in node s2 must be split at location 1, resulting in matching segmentations as illustrated in the figure including three segments in both nodes s1 and s2, including two single bit segments and one 30 bit segment. After the make compatible operation mkCompatible(n1, n2, . . . ) is completed on a set of nodes, the segmentation of the nodes in the set is consistent with that of all other nodes in the set, because all the cuts in one of the nodes will then exist in all the other nodes.

3. bitblast(n): This operator applies the split operator to a node n until it is segmented into single bit slices.

Figure 17:
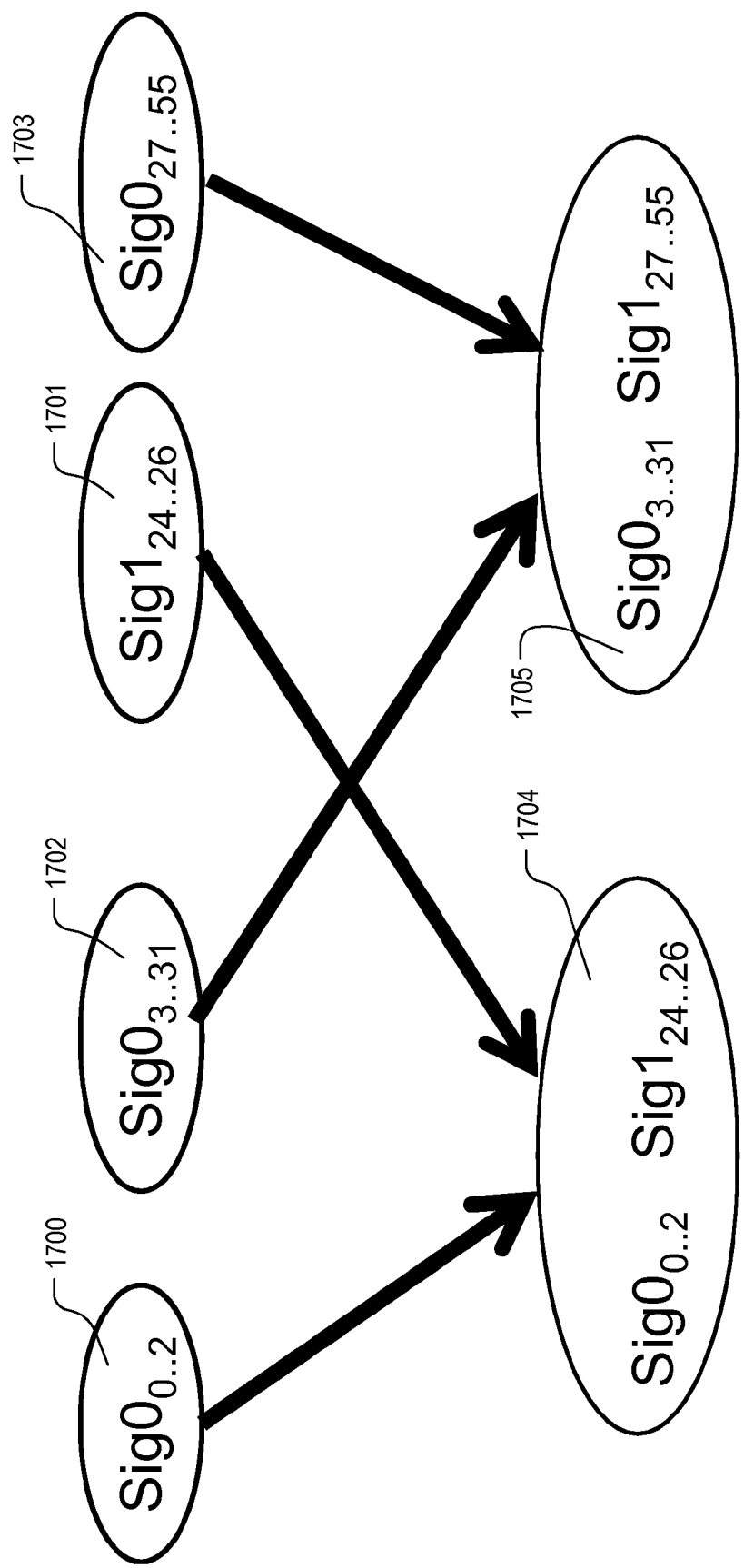
FIG. 17 illustrates an operation to make a set of nodes compatible.
Figure 18:
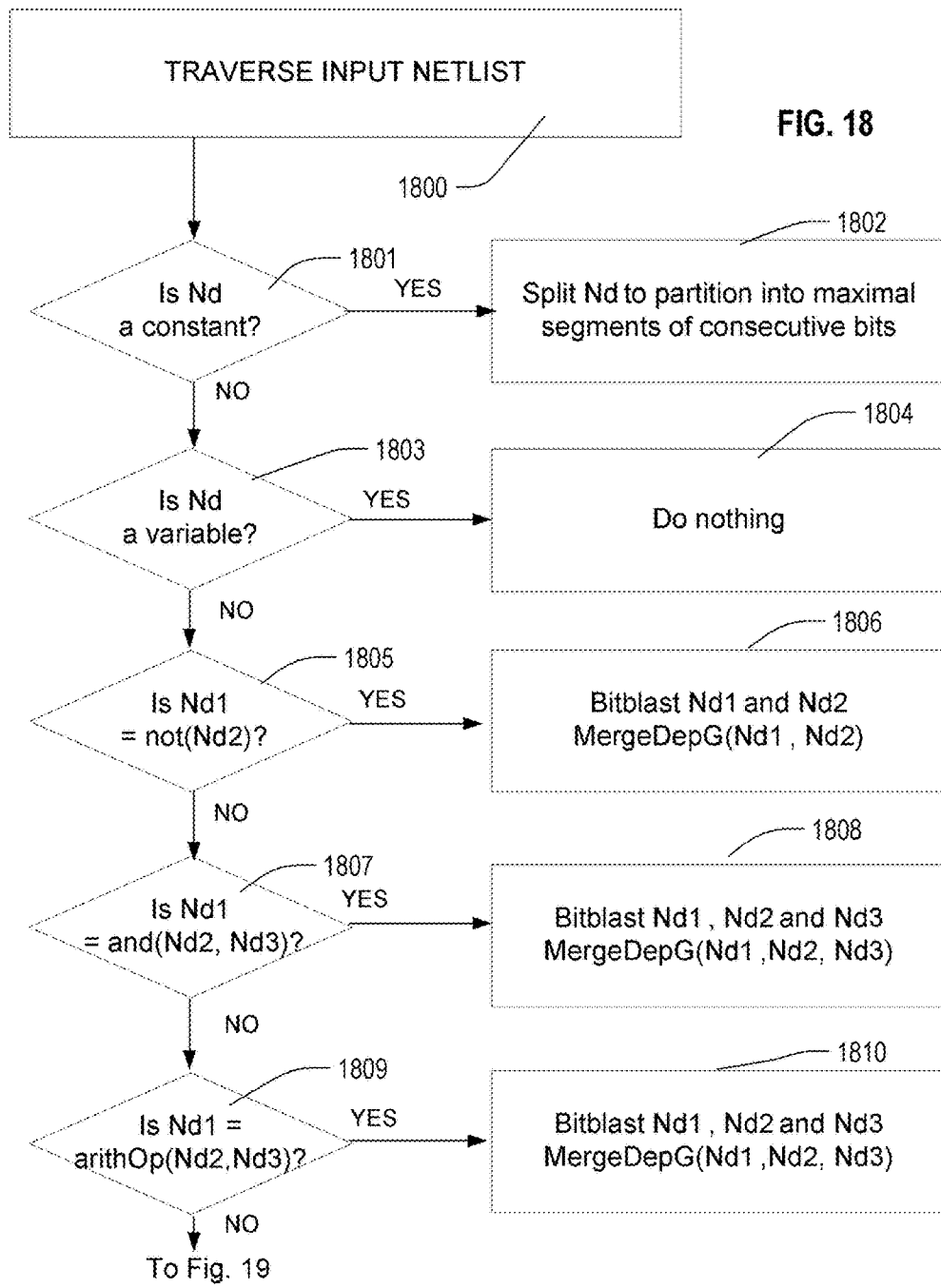
FIGS. 18-22 show a more detailed flow chart of a process for reducing the size of a data structure representing a circuit design.

The merge operator MergeDepGps(n1, n1, . . . ) takes a number of nodes whose segmentations match, having the same number of segments. The merge operator generates k new dependency groups by merging the dependency groups for all the first segments of its operands, merging the dependency groups for all the second segments of its operands and so on until k new dependency groups are formed. FIG. 17 illustrates the merge dependency group operation for nodes Sig0 and Sig1, where each of the nodes has a three bit segment (1700, 1701) and a 29 bit segment (1702, 1703). As a result of the operator, two new dependency classes (1704, 1705) are created which contain segments from both nodes Sig0 and Sig1.

FIGS. 18-22 illustrate a process for traversing an input data structure to produce a reduced netlist as described herein. The data flow analysis is performed by traversing the nodes in the data structure, which preferably has the form of a directed acyclic graph as mentioned above, in a depth first recursive manner where each node encountered is registered using the registerNode operator, and then processed (block 1800).

If the node is a constant (block 1801), the split operator is used to partition the node into its maximal segments of consecutive bits of the form 00 . . . 0 and 11 . . . 1(block 1802). Thus, the constant 000100 having the six locations 0-5, would be split into the segments (0,1), (2,2) and 3,5). Other techniques can be applied to constants which do not restrict the number of constants by dependency group to 2, including specific processing for each dependency group, or for selected types of dependency groups. The technique restricting the constants to 2, as described here is simple and fast, but may not lead to optimum segmentations.

If the node is a variable (block 1803) then nothing is done (block 1804).

If the node is the "not" in operator of the form node1 equal NOT node2 (block 1805), then the bit blast operator is applied on node1 and node2, and then the merge dependency group operator is applied (block 1806).

If the node is the "and" operator of the form node1 equal AND (node2, node3) (block 1807), then the bit blast operator is applied on node1, node2 and node3, and then the merge dependency group operator is applied (block 1808).

If the node is an arithmetic operator of the form node1 equal ARITHOP (node2, node3) (block 1809), then the bit blast operator is applied on node1, node2 and node3, and then the merge dependency group operator is applied (block 1810).

Figure 19:
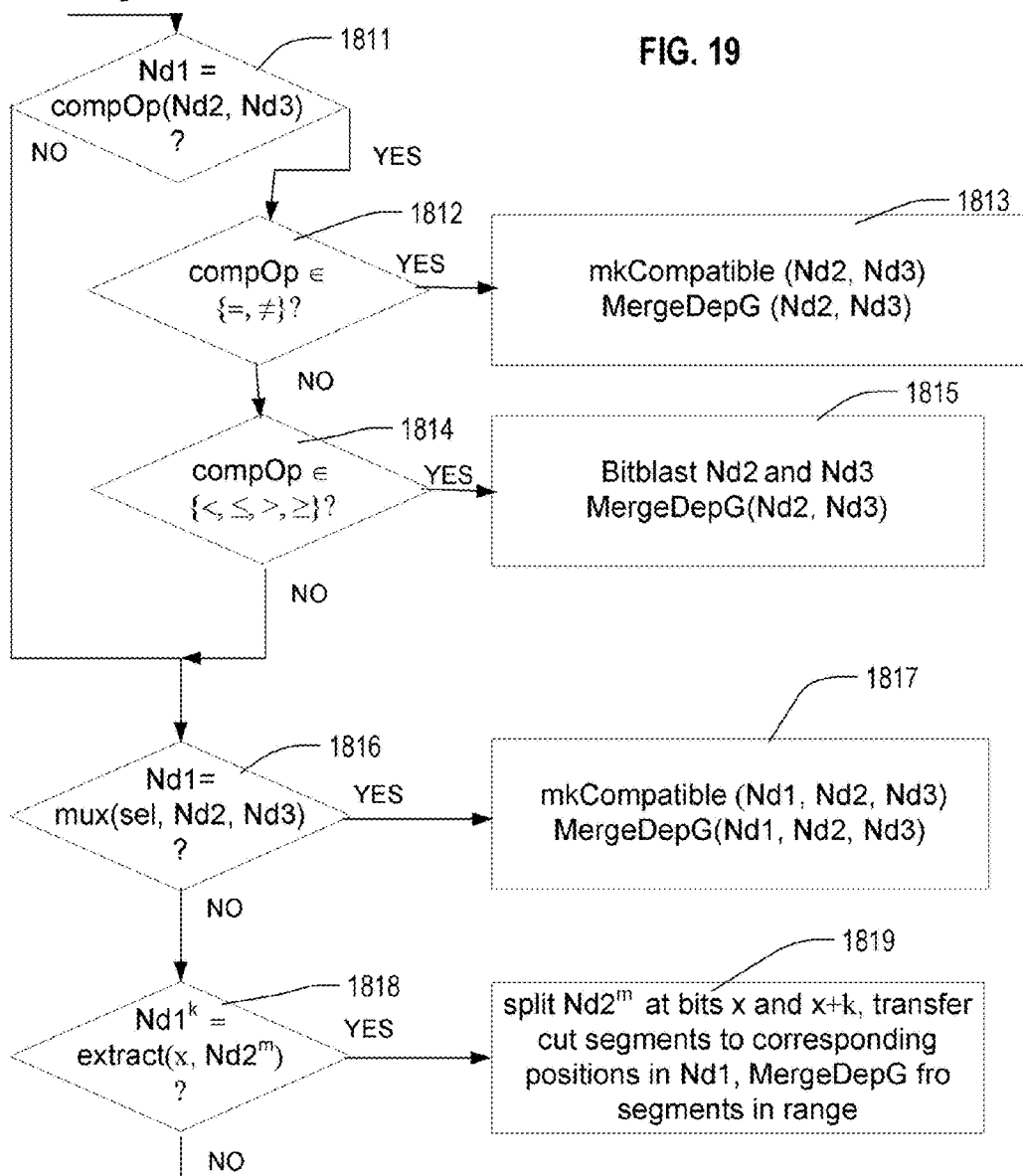

Proceeding to FIG. 19, if the node is a comparator operator of the form node1 equal compOp(node2 and node3), then the operation depends upon the type of operator (block 1811). If the operator one of the "equal to" or "not equal to" operators (block 1812), then the make compatible operator is applied over node1 and node2, and then the merge dependency group operator is applied (block 1813). If the operator is one of the "less than", "less than or equal to", greater than or equal to" and "greater than" operators (block 1814), then the bit blast operator is applied on node1 and node2, and then the merge dependency group operator is applied (block 1815).

If the operator is a multiplexer operator of the form node1 equal MUX (selector, node2, node3) (block 1816), then the make compatible operator is applied over node1, node2 and node3, and then the merge dependency group operator is applied (block 1817).

If the operator is an extraction operator of the form node1$^k$ equal EXTRACT (x, node2$^m$) (block 1818), then the split operator is used to introduce cuts at bit position x, and bit position x+k, if x+k is less than the width m of node2, where k is the width of node1. Then, all the segment cuts in the region between bit position x, and bit position x+k, and node2 are transferred to node1. Then the merge dependency group operator is applied for node1 and node2 (block 1819).

Figure 20:
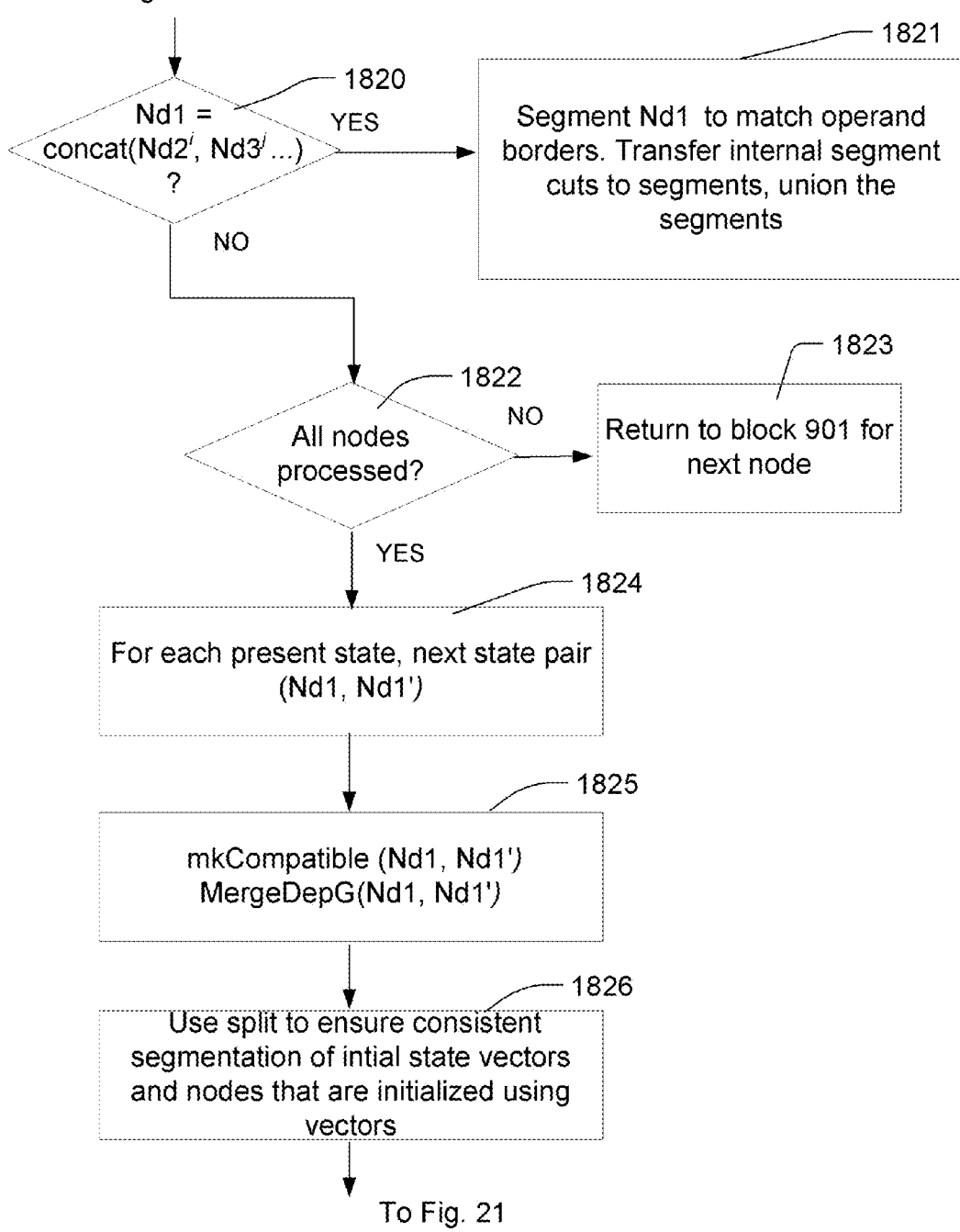

Proceeding to FIG. 20, if the operator is a concatenation operator of the form node1 equal concat(node2$^i$, node3$^j$ . . . ) (block 1820), then node1 is segmented to match the operand borders (i.e. location i, location i+j, etc.), and all of the internal segment cuts in the operands are transferred to the corresponding points in node1. Then the merge dependency group operator is applied for node1 and node2 (block 1821).

For example, consider the verification problem from FIG. 13. Assume we traverse the netlist by first visiting s0. This creates the partition information s0: (0 . . . 8) in a singleton dependency group. After visiting nodes n3, n4, n5, i1, n2, i2 and n1 we have the new segmentation s0: (0 . . . 2), (3 . . . 5), (6 . . . 8). The dependency group of s0: (0 . . . 2), now contain the other elements n1: (0 . . . 2), n2: (0 . . . 2), n3: (0 . . . 2), n4: (0 . . . 2), n5: (0 . . . 2), s0: (3 . . . 5) and s0: (6 . . . 8).

Next, it is determined whether all the nodes in the input data structure have been processed (block 1822). If not, then the procedure returns to block 1801 for a new node (block 1823). If they have all been processed, then all current-state and next-state variable pairs, (node1, node1') are traversed (block 1824). First, the make compatible operator is applied for each pair, and the merge dependency group operator is applied for each pair (block 1825). Finally, the split operator is used to ensure that the segmentation of each current state node is consistent with the segmentation of its initial state vector, which vector is used to set the value of a current state node when the simulation is started and which is segmented as a constraint like a constant as described with reference to block 1801 (block 1826).

After performing the data flow analysis, segment information for each node will result, with assurance that (1) the segmentation of current and next-state variables is consistent, (2) the segmentation of current-state variables and initial-state variables is consistent, and (3) the segment sources of size greater than one of the netlist DAG will only be propagated through multiplexor networks or be compared using the operators {equal to, not equal to}.

Figure 21:
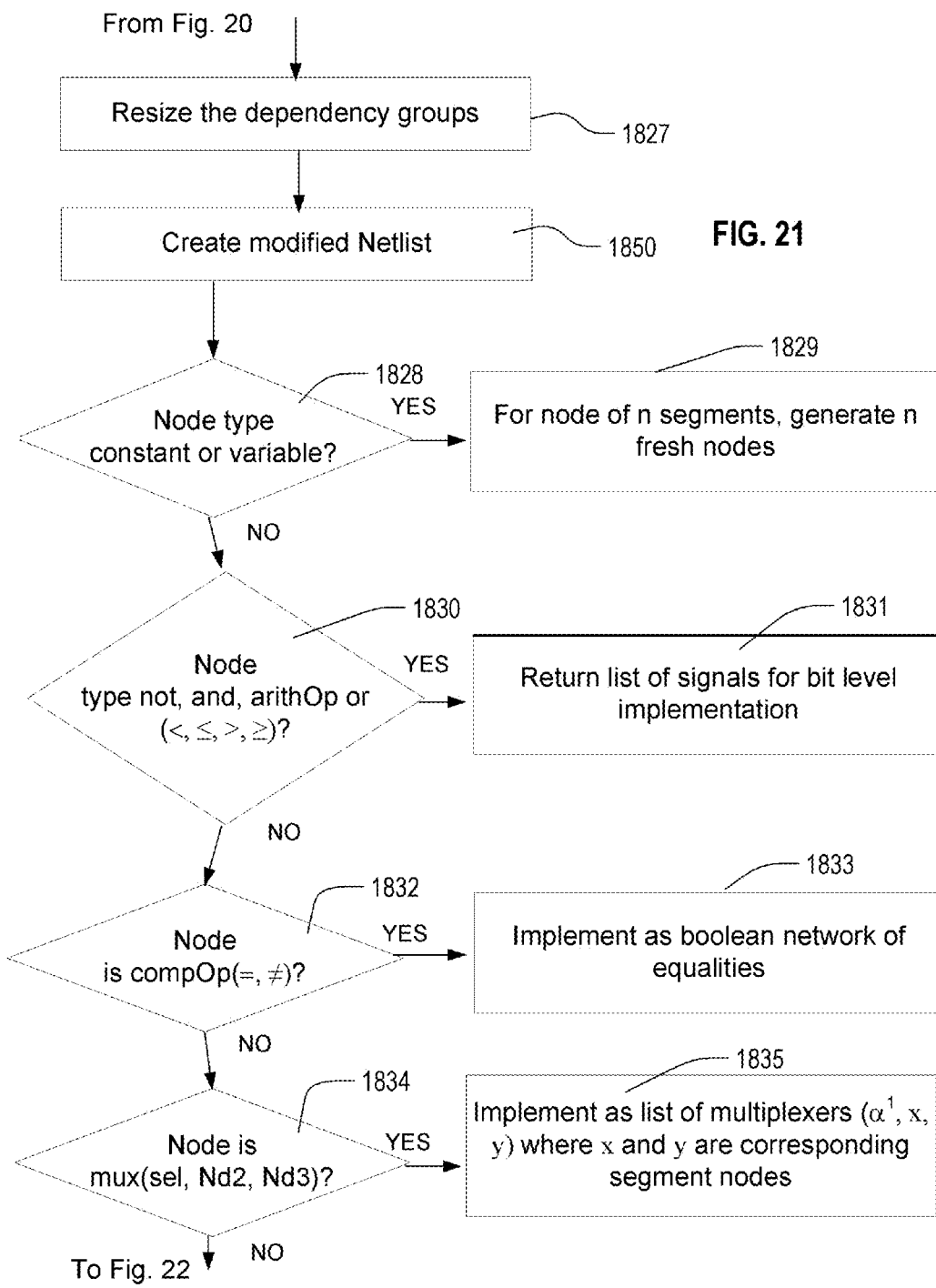

Proceeding to FIG. 21, at about this stage in the process, the algorithm visits each dependency group, and computes a new reduced size for the segments in the group by applying a resizing formula which guarantees that all properties of the node are preserved. The nodes are resized to the sum of the resized segments of the node (block 1827). A resizing formula useful in step 1827 can be explained as follows. The selectively bitblasted netlist now has two components: (1) A word-level component that reads packages from the inputs and word-level registers, moves them around using multiplexors, and performs package comparisons, and (2) A bit-level component that reads bit-level signals from the inputs, controls the multiplexors (possibly based on the outputs from comparison operators), and computes bit-level outputs. As the word-level variables are only compared for equality and inequality and moved around, they can be abstracted to provide reduced widths.

In a 1995 paper, Hojati and Brayton introduce a reduction for designs they refer to as Data Comparison Controllers (DCCs) (R. Hojati and R. Brayton. *Automatic datapath abstraction in hardware systems*, Proc. of the Computer Aided Verification Conf., 1995). These designs are partitioned into a boolean part and a datapath part that manipulate infinite packets modeled as integers by moving them around and comparing them, like the selectively bitblasted designs of the process described here. It is shown in Hojati and Brayton's paper that for every DCC, there always exists a finite smallest package size that preserves the status of the properties of the design. In fact, if the system has N infinite integer variables and M integer constant nodes, the integers can safely be modeled using length $S_{min}=[\log_2(N+M)]$ bit vectors.

This result cannot be applied directly here for two different reasons: (1) the selectively bitblasted packages do not have infinite initial size; and (2) there is more than one package size. However, as long as an initial packet size for a particular node is greater than some determinate minimum packet size, then the properties of the node will hold as long as a resized node is at least as large as the minimum of the initial packet size and the minimum packet size. A reduced safe size is determined for each dependency group, having an initial width greater than one. If the dependency group contains a number n constants, and a number m input and variable slices, then the reduced safe size is defined as: $\min(w_i, \log_2(n+m))$. Also note that due to the partitioning of constants in the example procedure described above, every dependency group can have at most one "all zeroes" constant and one "all ones" constant, as described above. So, M (the number of constants of a particular length) is always less than or equal to two in this example. Of course, other techniques for handling constants can be used, in which there are more than 2 possible constants as mentioned above.

After selective bitblasting, the resulting netlist has no facility for converting a size N word-level segment into some other size segment. Segments of a different width can hence not be compared, or registered in the same word-level register slices. The converted designs are therefore generalized DCCs, with one bit-level component, and a finite number of separate word-level components that only communicate with each other using bit-level signals. By iterating the argument in Hojati and Brayton, it can be seen that each of these word-level components can be abstracted individually. Therefore, reduced safe size can be computed as follows:

For each segment of size S in a node in a particular dependency group, there exists a number $N_S$ of state variable and input segments of size S in the dependency group. All properties of the selectively bitblasted netlist are preserved if the size S is adjusted to have a new size that is the $\min(S, \log_2(N_S+2))$. This results in a simple safe width. Also, other formulas or processes can be applied to find the minimum safe size, including more rigorous evaluation of the circuit represented by each dependency group to find a minimum safe size that may be smaller than found using the technique above.

When all word-level state variables and constants have been sized, the abstracted netlist is computed by rewriting the word-level components of the selectively bitblasted design to use variables and constants of the new correct size, and adjusting the width of the internal operators. So, returning to FIG. 21, the procedure progresses to produce a modified word-level netlist (block 1850) by converting each node in the original netlist into a list of new nodes, including one node per segment.

The modified netlist is produced by traversing the nodes, determining the type of node, and then performing an appropriate operation as follows. If the node is a variable or constant node having a number n segments (block 1828), then a list of the number n nodes is produced having the same node type, and sized according to the sizes assigned to the dependency groups of the segments (block 1829).

If the node is one of a "not" and "and", arithmetic operator, and a comparator operator of the type "less than", "less than or equal to", "greater than", and "greater than or equal to" (block 1830), then the previous processing will have produced single bit segmentation (bitblasted). So the resulting list of signals is returned corresponding to the bit-level implementation of the operator in terms of its inputs (block 1831).

If the node is a comparator operator of the form node1 equal CompOp (node2, node3) (block 1832), and the operator is one of the "equal to" or "not equal to" types, then node1 is implemented as a Boolean network of equalities over the respective segments (block 1833).

If the node is a multiplexer operator of the form node1 equal MUX (selector, node2, node3) (block 1834), then a list of multiplexers is produced of the form mux (selector, x,y), where each multiplexer takes a corresponding segmentation x, y of node2 and node3 (block 1835). For example, assume that a 32-bit wide multiplexer node of the form $mux^{32}(n1^1, n2^{32}, n3^{32})$ has been segmented into an 8-bit wide segment and a 16-bit wide segment (0 . . . 7), (8 . . . 31), and that the result of reimplementing $n1^1$ was $[m1^1]$, and that the result of reimplementing $n2^{32}$ and $n3^{32}$ was $[m2^{24}, m3^8]$ and $[m4^{24}, m5^8]$, respectively. Then we return a 24 bit wide multiplexer and an 8-bit wide multiplexer as follows: $[mux^{24}(m1^1, m2^{24}, m4^{24}), mux^8(m1^1, m3^8, m5^8)]$.

Figure 22:
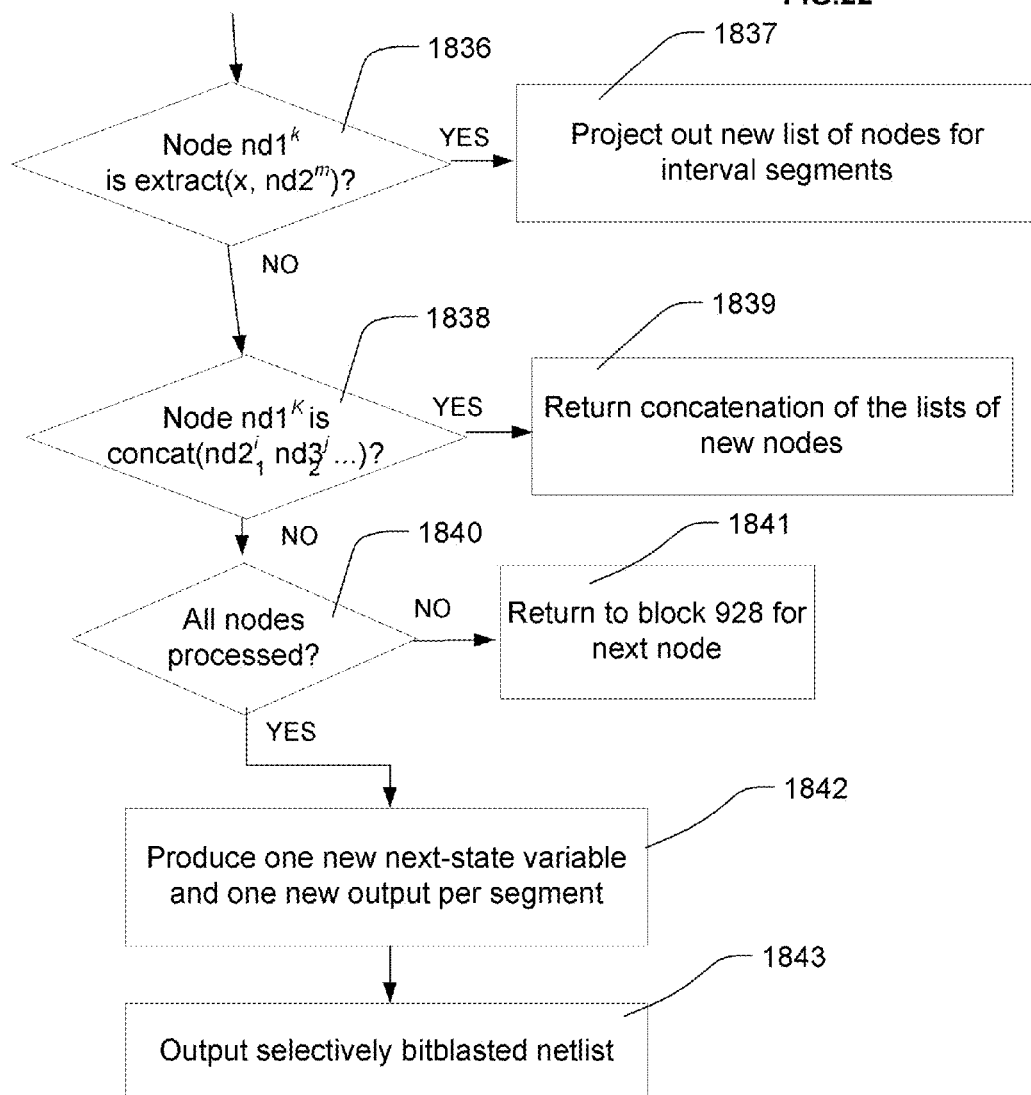
Figure 23:
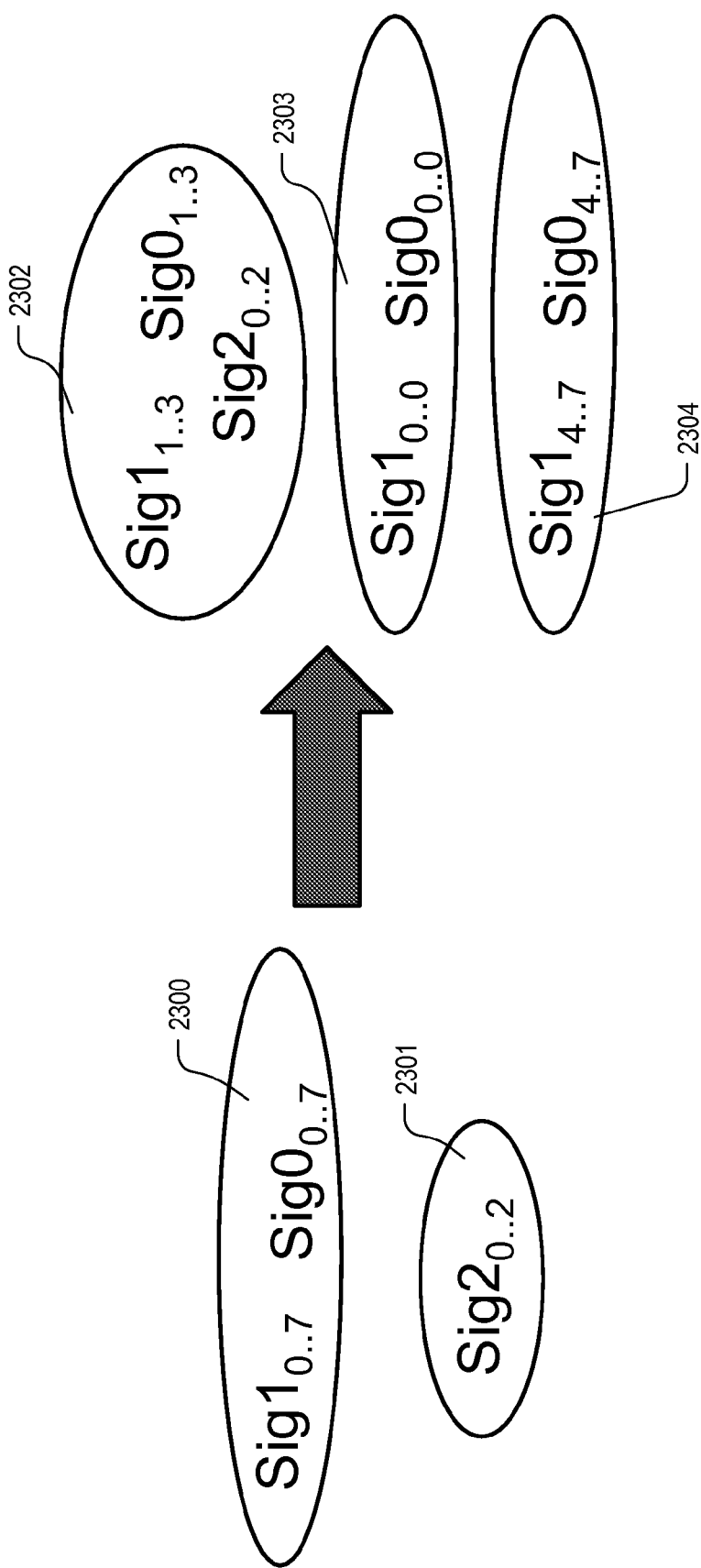
FIG. 23 illustrates an operation to process extraction nodes.

Proceeding to FIG. 22, if the node is an extraction operator of the form node1 equal extract(x, node2) (block 1836), then a new list of nodes is generated for the segmentation of node2 (block 1837). FIG. 23 illustrates an example of an extraction operation of the form $Sig2^3$=extract(x, Sig1), in which Sig1 is an 8-bit node that is a member of a dependency group 2300 with node Sig0. The extraction operator is a three bit wide operation producing a three bit wide node Sig2 2301, by extracting three bits starting at that location x in Sig1. Nodes Sig1 and Sig0 are split into a first set of three bit segments starting at that location x, which become members of dependency group 2302, with the output node Sig2, into single bit segments over bit location 0 which become members of dependency group 2303, and into a second set of three bit segments starting at bit location 4 which become members of the dependency group 2304.

If the node is a concatenation operator of the form node1 equal concat(node2, node3, . . . ) (block 1838), then a concatenation of the list of new nodes (i.e., nodes resulting from processing of (node2, node3, . . . ) is generated for the operands (block 1839).

Next, it is determined whether all the nodes in the data structure have been processed (block 1840). If not, then the procedure returns to block 1828 for a new node (block 1841).

If they have all been processed, then in order to produce the final segmented data structure, a new next-state variable or output is provided at the top of the directed acyclic graph, at each of the new reduced nodes feeding the top of the graph (block 1842). As a result of this processing, a selectively bitblasted netlist is produced (block 1843). The selectively bitblasted netlist includes nodes operating on signals having a bit width of one, that is bit-level signals which get processed using standard Boolean logic. In addition, the selectively bitblasted netlist includes word-level nodes operating on signals having a bit width greater than one. The word-level signals are moved through the netlist in a multiplexer network, which generates bit-level signals using comparison operators. Also, an original input or state variable in the design may have been split into several parts, some of which are bit-level and some of which are word-level.

In implementations of the technologies described above for particular netlists, constants are not shared among logic cones, because shared constants will force segmentation propagation from one cone to another unnecessarily. Thus, fresh variable nodes are introduced for each reference to a constant. At the end of the analysis, these introduced variable nodes are transformed back into constant nodes.

In addition, a circuit representation received from an HDL front end can be preprocessed to provide an improved starting point for the analysis. Specifically, the input netlists are swept to detect subgraphs where words are split up into bit-level signals, routed in a uniform way and recombined into word-level signals. These subgraphs are automatically re-implemented at the word-level.

In addition, symbolic memories represented as abstract read and write nodes can be processed as well. In this case, a write to memory, the segmentation of a value data transfers to all slots in the memory, and the value data becomes a member of the dependency class of all the slots in the memory. For a read, the segmentation from the memory will transfer to the output of the read node, and the dependency class of the output of the read node will include all the slots. In a write to an array with data having a particular segmentation, the segmentation is introduced to every memory location accessible by the write. In reads, the segmentation of the slots in the memory is applied to the read node.

A word-level model checking approach aimed at unbounded property checking for industrial netlists is described. The approach is based on a two-step method, where a quick analysis rewrites the netlist into a design where the word-level node segments that manipulate packages are completely separated from the rest of the logic. Then all packages are resized using statically computed safe lower bounds that guarantee preservation of the properties being checked. The resulting system can be analyzed using any standard bit-level model checking technique, or further processed using transformational verification simplifications.

A technology is introduced that uses word-level netlist information to identify remodellable memories. Such memories interact with their environment using dedicated read and write nodes only, are initialized in a specified way, and are accessed uniformly. An abstraction for netlists containing such memories is applied that allows proofs for certain types of properties for which the proof can be done by reasoning about a significantly smaller number of memory slots and time instances than what would be needed in a standard bit-level model check. In order to avoid having to rely on abstraction information from the users, a counter-example driven abstraction refinement framework can be used that analyzes spurious counter examples to incrementally refine the abstraction.

Features of the technology include that (1) it fits into a standard transformation-based verification system for safety property verification, (2) the algorithms are completely automatic, (3) no input is required on abstraction from users, and (4) any bit-level model checker can be used as the decision procedure in our abstraction refinement framework.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for processing a computer implemented representation of a circuit design, comprising:
representing the circuit design in a non-transitory machine readable medium, as a data structure defining a netlist as a plurality of nodes, including nodes representing a memory;
substituting selected nodes in the netlist representing the memory with substitute nodes implementing selected slots of the memory;
segmenting word level nodes, including one or more of the substitute nodes, in the netlist into segmented nodes and finding reduced safe sizes for the segmented nodes; and
generating an updated data structure representing the circuit design using the reduced safe sizes of the segmented nodes.

2. The method of claim 1, further including
identifying the selected nodes representing a memory in the data structure, and processing the netlist to produce an updated data structure, including
identifying a slot or slots in the memory for representation in the updated data structure; and
substituting the selected nodes in the netlist representing the memory with substitute nodes implementing the identified slot or slots.

3. The method of claim 1, wherein said substituting replaces the selected nodes representing memory with a set of substitute nodes, including
for each represented slot, current state and next state substitute nodes and current state and next state nodes identifying the represented slot, and
for nodes representing writes having a write address to a corresponding slot implementing a multiplexer updating contents of a next state substitute node for the corresponding slot with write data if the write address matches an output of the current state node identifying the represented slot, or else updating the contents of a next state substitute node for the corresponding slot with contents of a current state substitute node for the corresponding slot, and
for nodes in the netlist representing reads to a corresponding slot implementing a multiplexer returning contents of the current state substitute node for the corresponding slot if read address matches an output of the current state node identifying the represented slot, or else returning non-determinate data.

4. The method of claim 1, wherein the netlist comprises nodes arranged in a directed acyclic graph, including word-level nodes representing logical and arithmetic operators, word-level nodes representing multiplexer operators, word-level nodes representing concatenation operators, word-level nodes representing extraction operators, word-level nodes representing reads, word-level nodes representing writes, word-level nodes representing state variables and word-level nodes representing binary constants.

5. The method of claim 1, further including identifying said selected nodes representing a memory by determining for the memory and for a next state function for the memory that all read and write nodes addressing the memory, read and write data of the same width and use address nodes of the same width.

6. The method of claim 1, further including implementing a verification condition for the circuit design that enables checking of a pre-specified property of the circuit design using the updated data structure.

7. The method of claim 6, including implementing said verification condition by identifying abstraction pairs, said abstraction pairs including an abstracted node in the updated data structure corresponding to a current state substitute node in the updated data structure and a delay parameter indicating a cycle in which to read the current state substitute node using an output of the abstracted node, and establishing a set of nodes in the updated data structure that compares the abstracted node with the node identifying a represented slot for the corresponding current state substitute node in the indicated cycle, and if a match is indicated for the identified abstraction pairs, then checking the pre-specified property.

8. The method of claim 7, including performing a counter-example guided refinement process to identify the abstraction pairs.

9. The method of claim 7, including
providing an initial updated data structure;
performing a model checking process over the initial updated data structure, and if the model checking fails in a particular state, then running a simulation using the netlist defined by the first mentioned data structure, based on a set of inputs and initial state variable assignments determined from the particular state; if the simulation passes, then finding erroneous reads responsible for a failure detected in the updated data structure, selecting abstraction pairs to address the erroneous reads and adding the selected abstraction pairs to the updated data structure.

10. The method of claim 6, wherein the pre-specified property is a safety definition.

11. The method of claim 1, wherein the updated data structure comprises a netlist.

12. The method of claim 1, further including manufacturing an integrated circuit using said circuit design.

13. A method for processing a computer implemented representation of a circuit design, comprising:
representing the circuit design, in a non-transitory machine readable medium, as a data structure defining a netlist as a plurality of nodes including nodes representing a memory;
substituting selected nodes representing the memory with substitute nodes representing a selected slot or slots in the memory;
identifying a first set of nodes that includes word-level datapath nodes and one or more substitute nodes in the data structure;
segmenting the first set of nodes in the data structure into segmented nodes having segment widths corresponding to uniformly treated segments of corresponding words;
finding reduced safe sizes for the segmented nodes; and
generating an updated data structure representing the circuit design, using the reduced safe sizes of the segmented nodes.

14. The method of claim 13, further including converting a second set of word-level nodes in the plurality of nodes into bit-level nodes;
and wherein said generating uses the bit-level nodes.

15. The method of claim 14, further including
registering each node in the data structure and said one or more substitute nodes and constructing a dependency group including a node containing a segment $(0 \ldots k-1)$ where the node has a width k;
said segmenting includes performing an operation that splits nodes in the dependency group including a particular node in the first set until the segmentations of the nodes in the dependency group including the particular node match; and said converting includes performing an operation that splits nodes in the dependency group including a particular node in the second set, into single bit segments.

16. The method of claim 15, wherein said segmenting includes performing a split operation for a node in a target bit position, including finding a dependency group including a segment of a node containing a target bit position, and if the target bit position is between endpoints of the segment, dividing the dependency group into a first new dependency group containing first bit positions of the segment including the target bit position, and a second new dependency group containing the remaining bit positions of the segment.

17. The method of claim 15, wherein said updated data structure includes current state and next state variables, and said generating includes processing said current state and next state variables to ensure consistent segmentation, and be members of the same dependency group.

18. The method of claim 17, wherein the step of finding reduced safe sizes includes processing segments of the nodes in the dependency groups to find reduced safe sizes for the segments, and then summing the segments for each of the nodes.

19. The method of claim 17, wherein the step of finding reduced safe sizes includes processing segments of the nodes in a particular dependency group to find reduced safe sizes for the segments, and then summing the segments for each of the nodes, where the dependency group includes a segments of width S, and a number $N_S$ of state variable and input segments of size S, then the reduced safe size of segments in the dependency group is $\min(S, \log_2(N_S+M))$, where M is a number of constant segments within the dependency group.

20. The method of claim 13, wherein the updated data structure comprises a netlist that preserves a provability status of a pre-specified property.

21. The method of claim 13, further including manufacturing an integrated circuit using said circuit design.

22. A data processing system adapted to process a computer implemented representation of a circuit design, comprising:
a data processor and a memory coupled to the data processor, the memory storing instructions executable by the data processor representing the circuit design in the memory as a data structure defining a netlist as a plurality of nodes, including nodes representing a memory; including instructions
to substitute selected nodes in the netlist representing the memory with substitute nodes implementing identified slot or slots in the memory;
to segment word level nodes, including one or more of the substitute nodes, in the netlist into segmented nodes and to find reduced safe sizes for the segmented nodes; and
to generate an updated data structure representing the circuit design using the reduced safe sizes of the segmented nodes.

23. The data processing system of claim 22, including instructions
to identify the selected nodes representing a memory in the data structure;
to identify a slot or slots in the memory for representation in the updated data structure; and
to substitute the nodes in the netlist representing the memory with substitute nodes implementing the identified slot or slots.

24. The data processing system of claim 22, wherein said instructions replace the memory with a set of substitute nodes for each represented slot, said set including current state and next state substitute nodes and current state and next state nodes identifying the represented slot, and for nodes representing writes to a corresponding slot implementing a multiplexer updating contents of a next state substitute node for the corresponding slot with write data if write address matches an output of the current state node identifying the represented slot, or else updating the contents of a next state substitute node for the corresponding slot with contents of a current state substitute node for the corresponding slot, and for nodes in the netlist representing reads to a corresponding slot implementing a multiplexer returning contents of the current state substitute node for the corresponding slot if read address matches an output of the current state node identifying the represented slot, or else returning non-determinate data.

25. The data processing system of claim 22, wherein said instruction to identify nodes representing a memory includes instructions to determine for the memory and for the next state function for the memory that all read and write nodes address the memory, read and write data of the same width and use address nodes of the same width.

26. The data processing system of claim 22, including instructions implementing a verification condition by identifying abstraction pairs, said abstraction pairs including an abstracted node in the updated data structure corresponding to a current state substitute node in the updated data structure and a delay parameter indicating a cycle in which to read the current state substitute node using an output of the abstracted node, and establishing a set of nodes in the updated data structure that compares the abstracted node with the node identifying a represented slot for a corresponding current state substitute node in the indicated cycle, and if a match is indicated for the identified abstraction pairs, then checking a pre-specified property.

27. The data processing system of claim 26, including instructions for performing a counter-example guided refinement process to identify the abstraction pairs.

28. The data processing system of claim 26, including instructions
providing an initial updated data structure; and
performing a model checking process over the initial updated data structure, and if the model checking fails in a particular state, then running a simulation using the netlist defined by the first mentioned data structure based on a set of inputs and initial state variable assignments determined from the particular state; if the simulation passes, then finding erroneous reads responsible for a failure detected in the updated data structure, selecting abstraction pairs to address the erroneous reads and adding the selected abstraction pairs to the updated data structure.

29. The data processing system of claim 22, wherein the updated data structure comprises a netlist that preserves a provability status of a pre-specified property.

30. The data processing system of claim 22, wherein the updated data structure comprises a netlist.

31. An article of manufacture providing software adapted to process a computer implemented representation of a circuit design, comprising:
a memory readable by a data processor, the memory storing instructions executable by the data processor representing the circuit design in the memory as a data structure defining a netlist as a plurality of nodes, including nodes representing a memory; including instructions to substitute selected nodes in the netlist representing the memory with substitute nodes implementing identified slot or slots in the memory;

to segment word level nodes, including one or more of the substitute nodes, in the netlist into segmented nodes and to find reduced safe sizes for the segmented nodes; and to generate an updated data structure representing the circuit design using the reduced safe sizes of the segmented nodes.

* * * * *